(12) United States Patent
Kim et al.

(10) Patent No.: US 12,041,195 B2
(45) Date of Patent: Jul. 16, 2024

(54) ELECTRONIC APPARATUS INCLUDING FPCB STRUCTURE

(71) Applicant: Samsung Electronics Co., Ltd., Suwon-si (KR)

(72) Inventors: Minsoo Kim, Suwon-si (KR); Jiwoo Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 335 days.

(21) Appl. No.: 17/665,271

(22) Filed: Feb. 4, 2022

(65) Prior Publication Data

US 2022/0159112 A1    May 19, 2022

Related U.S. Application Data

(63) Continuation of application No. PCT/KR2020/009564, filed on Jul. 21, 2020.

(30) Foreign Application Priority Data

Aug. 6, 2019   (KR) ................. 10-2019-0095796

(51) Int. Cl.
*H05K 1/18*     (2006.01)
*H04M 1/02*    (2006.01)
(Continued)

(52) U.S. Cl.
CPC ....... *H04M 1/0277* (2013.01); *H04M 1/0262* (2013.01); *H05K 1/0207* (2013.01); *H05K 1/189* (2013.01); *G06F 1/1656* (2013.01)

(58) Field of Classification Search
CPC ............. H04M 1/0277; H04M 1/0262; H05K 1/0207; H05K 1/189; G06F 1/1656
See application file for complete search history.

(56) References Cited

U.S. PATENT DOCUMENTS 5,991,155 A    11/1999  Kobayashi et al.
8,982,580 B2 *  3/2015  Iwai ................. G06F 1/1626
                                                        361/752
(Continued)

FOREIGN PATENT DOCUMENTS

JP        2013095390 A       5/2013
KR   10-2016-0096927 A       8/2016
(Continued)

OTHER PUBLICATIONS

International Search Report and Written Opinion of the International Searching Authority dated Nov. 2, 2020, in connection with International Application No. PCT/KR2020/009564, 9 pages.

*Primary Examiner* — Hoa C Nguyen

(57) ABSTRACT

An electronic apparatus includes a housing; a first structure disposed inside the housing and includes a first surface; a second structure including a second surface facing the one surface of the housing; and a flexible printed circuit board (FPCB) structure disposed inside the housing. The FPCB structure includes: an FPCB including at least one coil; a thermally conductive first layer, including a first portion partially overlapping the FPCB and disposed between the FPCB and the second surface, and a second portion extending from the first portion and partially overlapping the first surface; a second layer having a higher elasticity and tensile strength than the first layer and includes a third portion at least partially overlapping the second portion, and a fourth portion extending from the third portion and at least partially overlapping the first portion; and a third layer disposed between the third portion and the first surface.

20 Claims, 18 Drawing Sheets

(51) Int. Cl.
   *H05K 1/02*    (2006.01)
   *G06F 1/16*    (2006.01)

(56) References Cited

U.S. PATENT DOCUMENTS

| | | | |
|---|---|---|---|
| 9,986,072 | B2 | 5/2018 | Lee et al. |
| 10,741,905 | B2 * | 8/2020 | Kim .................. H04B 15/00 |
| 2012/0112084 | A1 * | 5/2012 | Yamada ............. G01T 1/20188 |
| | | | 250/370.15 |
| 2014/0311425 | A1 | 10/2014 | Iwase et al. |
| 2016/0173673 | A1 * | 6/2016 | Hyun ................. H04M 1/0277 |
| | | | 455/566 |
| 2018/0287302 | A1 | 10/2018 | Kim et al. |
| 2019/0028804 | A1 * | 1/2019 | Zhao .................... H05K 7/1427 |
| 2019/0044391 | A1 * | 2/2019 | Jang ...................... H01F 38/14 |
| 2019/0097278 | A1 | 3/2019 | Park et al. |

FOREIGN PATENT DOCUMENTS

| | | | |
|---|---|---|---|
| KR | 10-2018-0109444 A | 10/2018 | |
| KR | 10-2019-0033830 A | 4/2019 | |
| WO | 2014045671 A1 | 3/2014 | |

* cited by examiner

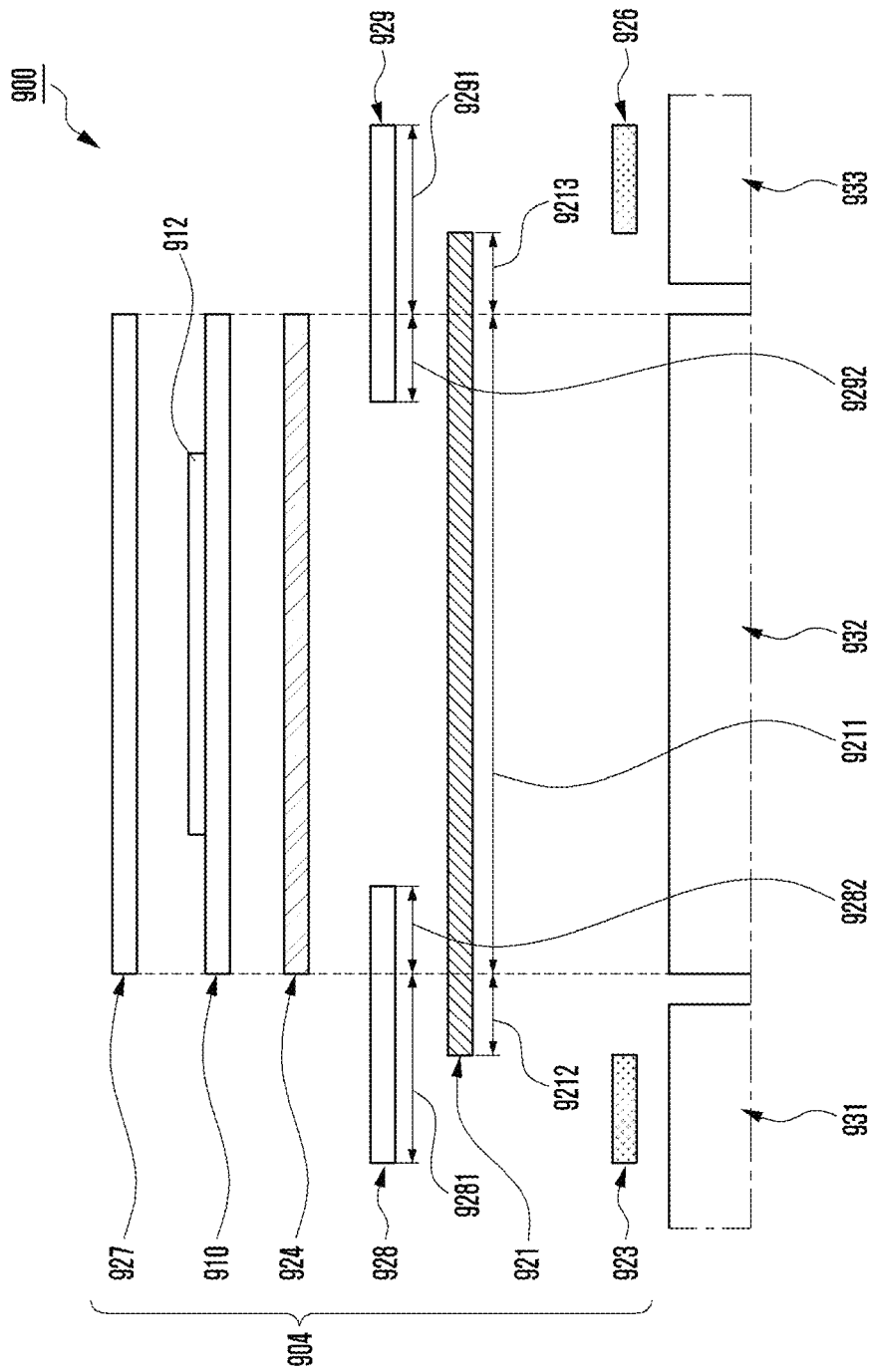

ELECTRONIC APPARATUS INCLUDING FPCB STRUCTURE

CROSS-REFERENCE TO RELATED APPLICATIONS

This application is a Bypass Continuation of International Application No. PCT/KR2020/009564 filed on Jul. 21, 2020, which claims priority to Korean Patent Application No. 10-2019-0095796 filed on Aug. 6, 2019, the disclosures of which are herein incorporated by reference in their entirety.

BACKGROUND

1. Field

Various embodiments of the disclosure relate to an electronic device including a flexible printed circuit board (FPCB) structure.

2. Description of Related Art

With advances in digital technology, electronic devices are being provided in various forms such as smartphones, tablet personal computers (PCs), or personal digital assistants (PDAs). Electronic devices are also being developed in a form that can be worn by users to improve portability and user accessibility. In an electronic device, the battery may generate heat due to components that consume a lot of current, such as a processor (e.g., application processor (AP)), a communication module, or a charging module, or due to current consumption in these components. For example, if the processor has a lot of work to do, or the communication module is continuously driven to receive a signal, more heat than normal can generate. This heat can degrade system performance or even affect the battery in the worst case, increasing the possibility of explosion. Since it is difficult to mount an active structure such as a cooling fan due to the slimness of the electronic device, the electronic device may include, for example, a heat spreader as a cooling system for heat management. The heat spreader may disperse heat generated inside the electronic device so that it is not concentrated in one spot.

SUMMARY

Electronic devices are becoming slimmer, and heat spreaders may be implemented in the form of a thin plate, sheet, or film. Such a heat spreader may be implemented by expanding its area to increase heat diffusion efficiency or heat dissipation efficiency. For example, the heat spreader may be attached to a plurality of structures while covering the plurality of structures in the electronic device. However, such a heat spreader and its attachment structure may cause breakage (e.g., tearing) of the heat spreader when external impact occurs due to a drop or an external force. As the plurality of structures in the electronic device are coupled to each other but have different masses (or, mass centers) or weights, they may be shaken in different directions or with different displacements when external impact occurs due to a fall or an external force. This shaking of the structures can cause the heat spreader to break.

Various embodiments of the disclosure may provide an electronic device including a flexible printed circuit board (FPCB) structure, which reduces damage to a heat spreader disposed in the electronic device from external impact caused by a drop or external force.

The technical objectives to be achieved in the disclosure are not limited to those described above, and other technical objectives not mentioned can be clearly understood by those of ordinary skill in the art to which the disclosure belongs from the following description.

According to an embodiment of the disclosure, an electronic device may include: a housing; a first structure that is disposed in the housing and includes a first surface facing one surface of the housing; a second structure including a second surface facing the one surface of the housing; and an FPCB structure disposed in the housing and extended from the first surface to the second surface, the FPCB structure including: a flexible printed circuit board (FPCB) that at least partially overlaps the second surface and includes at least one coil; a thermally conductive first layer that at least partially overlaps the FPCB and includes a first portion disposed between the FPCB and the second surface, and a second portion that is extended from the first portion to at least partially overlap the first surface; a second layer that includes a third portion at least partially overlapping the second portion, and a fourth portion that is extended from the third portion to partially overlap the first portion, the second layer being more elastic and having a greater tensile strength than the first layer; and an adhesive third layer disposed between the third portion and the first surface.

In various embodiments of the disclosure, by adding an elastic layer that can elastically withstand external impact to the FPCB structure including a thermal diffusion sheet having a material such as graphite, it is possible to prevent breakage or delamination of the thermal diffusion sheet due to external impact. Further, since the elastic layer is added instead of expanding the FPCB as a support for protecting the thermal diffusion sheet from external impact, material cost can be reduced.

In addition, effects obtainable or predicted by various embodiments of the disclosure will be disclosed directly or implicitly in the detailed description of the embodiments of the disclosure. For example, various effects predicted according to various embodiments of the disclosure will be disclosed in the detailed description to be described later.

Before undertaking the DETAILED DESCRIPTION below, it may be advantageous to set forth definitions of certain words and phrases used throughout this patent document: the terms "include" and "comprise," as well as derivatives thereof, mean inclusion without limitation; the term "or," is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, such a device may be implemented in hardware, firmware or software, or some combination of at least two of the same. It should be noted that the functionality associated with any particular controller may be centralized or distributed, whether locally or remotely.

Moreover, various functions described below can be implemented or supported by one or more computer programs, each of which is formed from computer readable program code and embodied in a computer readable medium. The terms "application" and "program" refer to one or more computer programs, software components, sets of instructions, procedures, functions, objects, classes, instances, related data, or a portion thereof adapted for implementation in a suitable computer readable program code. The phrase "computer readable program code" includes any type of computer code, including source code, object code, and executable code. The phrase "computer readable medium" includes any type of medium capable of being accessed by a computer, such as read only memory (ROM), random access memory (RAM), a hard disk drive, a compact disc (CD), a digital video disc (DVD), or any other type of memory. A "non-transitory" computer readable medium excludes wired, wireless, optical, or other communication links that transport transitory electrical or other signals. A non-transitory computer readable medium includes media where data can be permanently stored and media where data can be stored and later overwritten, such as a rewritable optical disc or an erasable memory device.

Definitions for certain words and phrases are provided throughout this patent document, those of ordinary skill in the art should understand that in many, if not most instances, such definitions apply to prior, as well as future uses of such defined words and phrases.

BRIEF DESCRIPTION OF THE DRAWINGS

For a more complete understanding of the present disclosure and its advantages, reference is now made to the following description taken in conjunction with the accompanying drawings, in which like reference numerals represent like parts:

FIG. 9A illustrates an exploded cross-sectional view of the FPCB structure in the electronic device according to various embodiments of this disclosure;

DETAILED DESCRIPTION

Figure 1A:
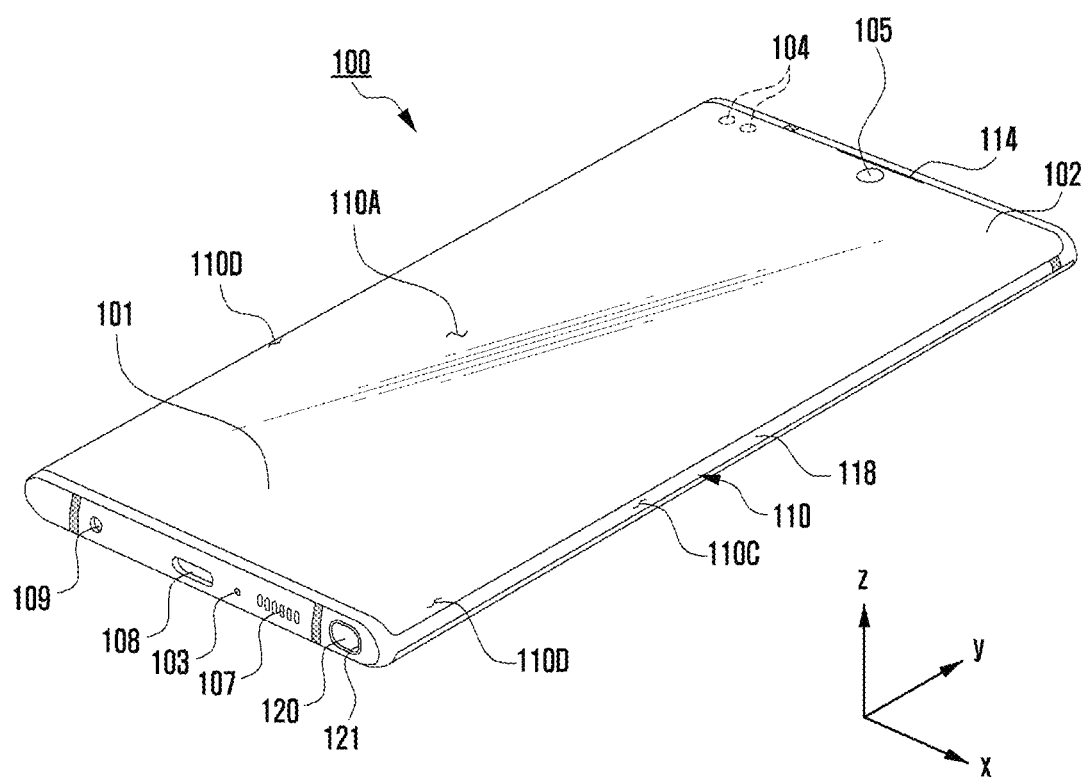
FIG. 1A illustrates a front perspective view of a mobile electronic device according to an embodiment of this disclosure.

FIGS. 1A through 11B, discussed below, and the various embodiments used to describe the principles of the present disclosure in this patent document are by way of illustration only and should not be construed in any way to limit the scope of the disclosure. Those skilled in the art will understand that the principles of the present disclosure may be implemented in any suitably arranged system or device.

Hereinafter, various embodiments of the present document will be described with reference to the accompanying drawings.

It should be understood that the various embodiments of the present document and the terminology used are not intended to limit the technical features described herein to specific embodiments but to include various modifications, equivalents, and/or alternatives thereof. In connection with the description of the drawings, similar reference symbols may be used for similar or related components. The singular form of a noun corresponding to an item may include one or multiple instances of the item unless clearly indicated otherwise in a related context. In the present document, the expression "A or B", "at least one of A and B", "at least one of A or B", "A, B or C", "at least one of A, B and C", or "at least one of A, B or C" may include any one of the listed items or all possible combinations thereof. The terms "1$^{st}$" and "2$^{nd}$" or "first" and "second" may be used to simply distinguish one element from another element, without limiting corresponding elements in another aspect (e.g., importance or order). It will be understood that when an element (e.g., first element) is referred to as being "coupled with/to" or "connected with/to" another element (e.g., second element) with/without a term "operably" or "communicatively", it can be coupled or connected with/to the other element directly (e.g., wiredly), wirelessly, or via a third element.

According to various embodiments, each of the components (e.g., modules or programs) described above may include singular or plural entities. In various embodiments, one or more components or operations may be omitted from the corresponding components described above, or one or more different components or operations may be added. Alternatively or additionally, plural components (e.g., modules or programs) may be combined into one component. In this case, the combined component may perform one or more functions identical or similar to those of the plural components before combination. According to various embodiments, operations performed by a module, program, or another component may be carried out in sequence, in parallel, by repetition, or heuristically, and one or more of the operations may be executed in a different order or may be omitted, or one or more different operations may be added.

The electronic device according to various embodiments disclosed herein can be one of various types of devices. The electronic device may include, for example, a portable communication device (e.g., smartphone), a computer, a portable multimedia device, a portable medical instrument, a camera, a wearable device, or a home appliance. However, the electronic device according to an embodiment of the present document is not limited to the above-mentioned devices.

Figure 1B:
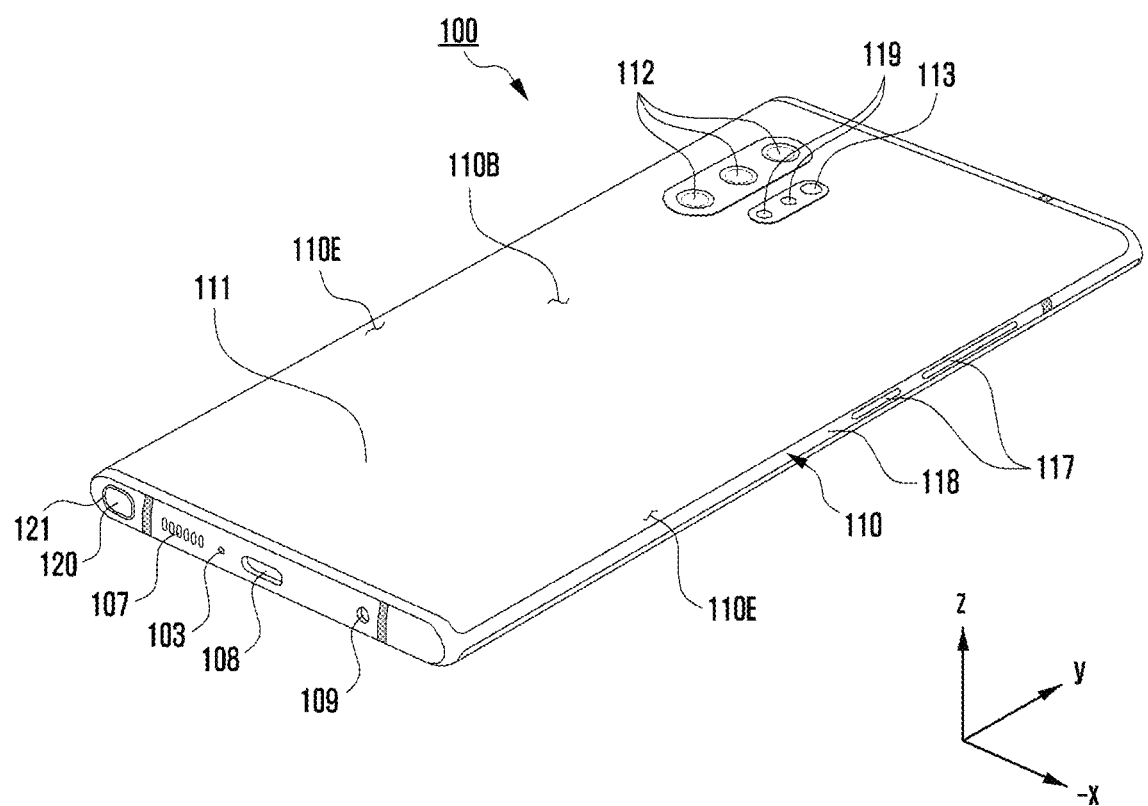
FIG. 1B illustrates a rear perspective view of the electronic device of FIG. 1A according to an embodiment of this disclosure.

FIG. 1A illustrates a front perspective view of an electronic device 100 according to an embodiment of this disclosure. FIG. 1B illustrates is a rear perspective view of the electronic device 100 of FIG. 1A according to an embodiment of this disclosure.

With reference to FIGS. 1A and 1B, the electronic device 100 according to an embodiment may include a housing 110 that includes a first surface (or front surface) 110A, a second surface (or rear surface) 110B, and a side surface 110C surrounding a space between the first surface 110A and the second surface 110B. In another embodiment (not shown), the housing 110 may refer to a structure forming a part of the first surface 110A, the second surface 110B, and the side surface 110C in FIG. 1A. According to an embodiment, the first surface 110A may be formed by a front plate 102 (e.g., glass plate or polymer plate including various coating layers) whose at least a portion is substantially transparent. The second surface 110B may be formed by a rear plate 111 that is substantially opaque. The rear plate 111 may be formed by, for example, coated or tinted glass, ceramic, polymer, metal (e.g., aluminum, stainless steel (STS), or magnesium), or a combination of at least two thereof. The side surface 110C may be formed by a side bezel structure (or "side member") 118 coupled to the front plate 102 and the rear plate 111 and including a metal and/or a polymer. In a certain embodiment, the rear plate 111 and side bezel structure 118 may be integrally formed and include the same material (e.g., metal material such as aluminum).

In the illustrated embodiment, the front plate 102 may include two first regions 110D that are curved and seamlessly extended from the first surface 110A toward the rear plate 111 respectively at opposite ends of the longer edges of the front plate 102. In the illustrated embodiment (see FIG. 1B), the rear plate 111 may include two second regions 110E that are curved and seamlessly extended from the second surface 110B toward the front plate 102 respectively at opposite ends of the longer edges. In a certain embodiment, the front plate 102 (or, rear plate 111) may include one of the first regions 110D or one of the second regions 110E. In another embodiment, some of the first regions 110D or the second regions 110E may be not included. In the above embodiments, when the electronic device 100 is viewed from the side thereof, the side bezel structure 118 may have a first thickness (or width) on a side where one of the first regions 110D or the second regions 110E is not included, and may have a second thickness thinner than the first thickness on a side where one of the first regions 110D or one of the second regions 110E are included.

According to an embodiment, the electronic device 100 may include at least one of a display 101, audio modules 103, 107 and 114, sensor modules 104 and 119, camera modules 105, 112 and 113, key input devices 117, a pen input device 120, or connector holes 108 and 109. In a certain embodiment, at least one of the elements (e.g., key input devices 117) may be omitted from the electronic device 100, or another element (e.g., fingerprint sensor, or light-emitting element) may be added to the electronic device 100.

The display 101 may be exposed, for example, through a significant portion of the front plate 102. In a certain embodiment, at least a portion of the display 101 may be exposed through the front plate 102 forming the first surface 110A and the first regions 110D of the side surface 110C. In a certain embodiment, the edge of the display 101 may be configured to have substantially the same shape as the adjacent periphery of the front plate 102. In another embodiment (not shown), to expand the exposed area of the display 101, the distance between the periphery of the display 101 and the periphery of the front plate 102 may be formed substantially the same.

In another embodiment (not shown), a recess or opening may be formed in a portion of the screen display area of the display 101 and at least one of the audio modules (e.g., audio module 114), the sensor module 104, or the camera module 105 may be included in alignment with the recess or the opening. In another embodiment (not shown), at least one of the audio modules (e.g., audio module 114), the sensor module 104, or the camera module 105 may be included on the back of the screen display area of the display 101. In another embodiment (not shown), the display 101 may be disposed to be coupled or adjacent to a touch sensing circuit, a pressure sensor capable of measuring the intensity (pressure) of touch, and/or a digitizer for detecting a magnetic field type stylus pen. In a certain embodiment, at least some of the sensor modules 104 and 119, and/or at least some of the key input devices 117 may be disposed on one of the first regions 110D and/or one of the second regions 110E.

The audio modules 103, 107 and 114 may include a microphone hole (e.g., audio module 103), and speaker holes (e.g., audio modules 107 and 114). The microphone hole may include a microphone disposed therein to obtain an external sound, and a plurality of microphones may be arranged to sense the direction of a sound in a certain embodiment. The speaker holes may include an external speaker hole and a call receiver hole. In a certain embodiment, the speaker holes and the microphone hole may be implemented as a single hole, or a speaker may be included without a speaker hole (e.g., piezo speaker).

The sensor modules 104 and 119 may generate an electrical signal or a data value corresponding to, for example, an internal operating state of the electronic device 100 or an external environmental state. The sensor modules 104 and 119 may include, for example, a first sensor module (e.g., sensor module 104 (e.g., proximity sensor)) and/or a second sensor module (not shown) (e.g., fingerprint sensor) disposed on the first surface 110A of the housing 110, and/or a third sensor module (e.g., sensor module 119) (e.g., HRM sensor) and/or a fourth sensor module (e.g., fingerprint sensor) disposed on the second surface 110B of the housing 110. The fingerprint sensor may be disposed not only on the first surface 110A (e.g., display 101) of the housing 110 but also on the second surface 110B. The electronic device 100 may further include a sensor module which is not shown, for example, at least one of a gesture sensor, a gyro sensor, a barometric pressure sensor, a magnetic sensor, an acceleration sensor, a grip sensor, a color sensor, an infrared (IR) sensor, a biometric sensor, a temperature sensor, a humidity sensor, or an illuminance sensor (e.g., sensor module 104).

The camera modules 105, 112 and 113 may include a first camera device (e.g., camera module 105) disposed on the first surface 110A of the electronic device 100, a second camera device (e.g., camera module 112) disposed on the second surface 110B, and/or a flash (e.g., camera module 113). The first and second camera devices may include one or plural lenses, an image sensor, and/or an image signal processor. The flash includes, for example, a light emitting diode or a xenon lamp. In a certain embodiment, two or more lenses (infrared camera, wide-angle and telephoto lenses) and image sensors may be arranged in one surface of the electronic device 100.

The key input devices 117 may be arranged in the side surface 110C of the housing 110. In another embodiment, the electronic device 100 may not include some or all of the above-mentioned key input devices 117, and a key input device 117 not included may be implemented on the display 101 in a different form such as a soft key. In a certain embodiment, the key input device may include a sensor module (not shown) disposed on the second surface 110B of the housing 110.

The light emitting element (not shown) may be disposed on the first surface 110A of the housing 110. The light emitting element may provide state information of the electronic device 100 in a light form. In another embodiment, the light emitting element may provide a light source interacting with, for example, the operation of the camera module 105. The light emitting element may include, for example, an LED, an infrared (IR) LED, or a xenon lamp.

The connector holes 108 and 109 may include a first connector hole (e.g., connector hole 108) capable of accepting a connector (e.g., USB connector) for transmitting and/or receiving power and/or data to and/or from an external electronic device, and/or a second connector hole (e.g., connector hole 109) (e.g., earphone jack) capable of accepting a connector for transmitting and/receiving an audio signal to and/or from an external electronic device.

The pen input device 120 (e.g., stylus pen) may be inserted or detached by being guided into the housing 110 through a hole 121 formed in the side surface of the housing 210. The pen input device 120 may include a button for facilitating its detachment. The pen input device 120 may be equipped with a separate resonance circuit, which may interwork with an electromagnetic induction panel (e.g., electromagnetic induction panel 290 in FIG. 2) included in the electronic device 100. According to an embodiment, the pen input device 120 may include an electromagnetic induction scheme (e.g., electro-magnetic resonance (EMR) method).

According to various embodiments, the pen input device 120 may be implemented with an electro-magnetic resonance (EMR) scheme, an active electrical stylus (AES), or an electric coupled resonance (ECR) scheme.

Figure 2:
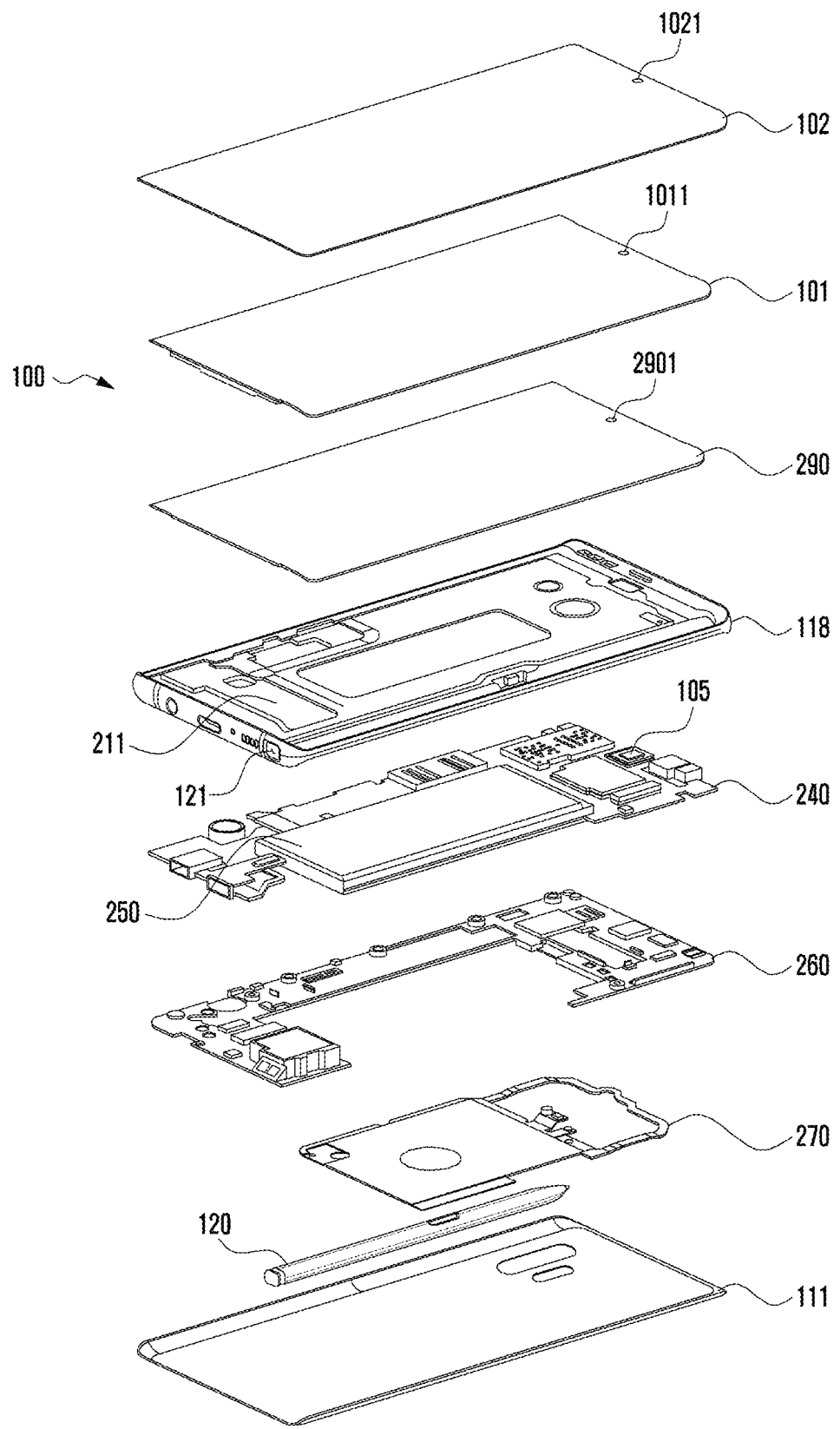
FIG. 2 illustrates an exploded perspective view of the electronic device of FIG. 1A according to an embodiment of this disclosure.

FIG. 2 illustrates an exploded perspective view of the electronic device 100 of FIG. 1A according to an embodiment of this disclosure.

With reference to FIG. 2, according to an embodiment, the electronic device 100 may include a side bezel structure 118, a first support member 211 (e.g., bracket), a front plate 102, a display 101, an electromagnetic induction panel 290, a printed circuit board (PCB) 240, a battery 250, a second support member 260 (e.g., rear case), an antenna 270, a pen input device 120, or a rear plate 111. In a certain embodiment, at least one of the components (e.g., first support member 211, or second support member 260) may be omitted from the electronic device 100, or another component may be additionally included in the electronic device 100. At least one of the components of the electronic device 100 may be identical or similar to at least one of the components of the electronic device 100 in FIG. 1A or 1B, and a repeated description thereof will be omitted below.

According to an embodiment, the electromagnetic induction panel 290 (e.g., digitizer) may be a panel for detecting an input of the pen input device 120. For example, the electromagnetic induction panel 290 may include a printed circuit board (PCB) (e.g., flexible printed circuit board (FPCB)) and a shielding sheet. An electromagnetic field may be generated from the components (e.g., display 101, printed circuit board 240, electromagnetic induction panel 290) included in the electronic device 100, and the shielding sheet may prevent interference between the components caused by the electromagnetic field. The shielding sheet may block electromagnetic fields generated from the components, so that an input from the pen input device 120 can be accurately transmitted to a coil included in the electromagnetic induction panel 290. The electromagnetic induction panel 290 according to various embodiments may include an opening 2901 formed at least a portion corresponding to an optical sensor (e.g., camera module 105 or biometric sensor) disposed inside the electronic device 100.

The first support member 211 may be arranged, for example, inside the electronic device 100, and may be connected to the side bezel structure 118 or may be integrally formed with the side bezel structure 118. The first support member 211 may be made of, for example, a metal material and/or a non-metal material (e.g., polymer). The display 101 may be coupled to one surface of the first support member 211, and the printed circuit board 240 may be coupled to the other surface of the first support member 211. A processor, a memory, and/or an interface may be mounted on the printed circuit board 240. The processor may include one or more of, for example, a central processing unit, an application processor, a graphics processing unit, an image signal processor, a sensor hub processor, and a communication processor.

The memory may include, for example, a volatile memory or a non-volatile memory.

The interface may include, for example, a high definition multimedia interface (HDMI), a universal serial bus (USB) interface, an SD card interface, and/or an audio interface. The interface may electrically or physically connect, for example, the electronic device 100 to an external electronic device, and may include a USB connector, an SD card/MMC connector, or an audio connector.

The battery 250 is a device for supplying power to at least one component of the electronic device 100, and may include, for example, a non-rechargeable primary cell, a rechargeable secondary cell, or a fuel cell. At least a portion of the battery 250 may be disposed substantially coplanar with the printed circuit board 240, for example. The battery 250 may be integrally disposed inside the electronic device 100, or may be disposed attachably and detachably with the electronic device 100.

The antenna 270 may be disposed between the rear plate 111 and the battery 250. The antenna 270 may include, for example, a near field communication (NFC) antenna, a wireless charging antenna, and/or a magnetic secure transmission (MST) antenna. The antenna 270 may perform short-range communication with an external device or wirelessly transmit and receive power used for charging. In another embodiment, an antenna structure may be formed by a part of the side bezel structure 118 and/or the first support member 211 or a combination thereof.

According to an embodiment, the second support member 260 may be disposed between the first support member 211 and the rear plate 111. The second support member 260 may be coupled to the first support member 211 through a fastening element such as a bolt. At least some of the printed circuit board 240 may be disposed between the first support member 211 and the second support member 260, and the second support member 260 may cover the printed circuit board 240 for protection.

According to various embodiments, the display 101 may include an opening 1011 formed at least a portion corresponding to an optical sensor (e.g., camera module 105 or biometric sensor) disposed inside the electronic device 100. The optical sensor may receive external light through a portion of the front plate 102, the opening 1011 of the display 101 aligned therewith, and the opening 2901 of the electromagnetic induction panel 290. According to various embodiments (not shown), by replacing the opening 1011 of the display 101, it may be implemented as a substantially transparent region formed by modifying the pixel structure and/or wiring structure.

Figure 3:
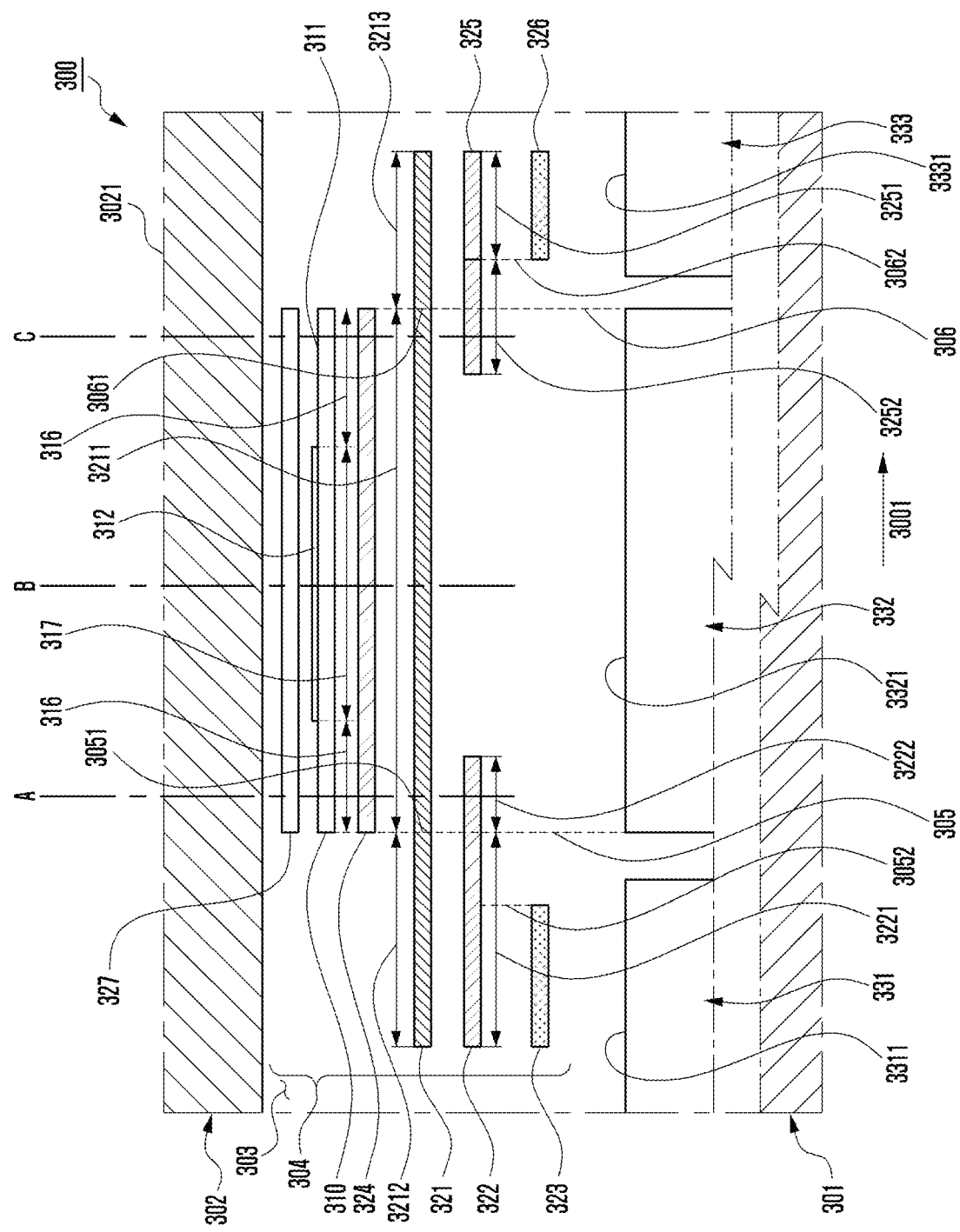
FIG. 3 illustrates an exploded cross-sectional view of a flexible printed circuit board (FPCB) structure in the electronic device according to an embodiment of this disclosure.

FIG. 3 illustrates an exploded cross-sectional view of an FPCB structure 304 in the electronic device according to an embodiment of this disclosure.

With reference to FIG. 3, in one embodiment, the electronic device 300 (e.g., electronic device 100 in FIG. 2) may include a front plate 301, a rear plate 302, an FPCB structure 304, a first structure 331, a second structure 332, or a third structure 333. According to an embodiment, the FPCB structure 304, the first structure 331, the second structure 332, or the third structure 333 may be disposed in a space 303 between the front plate 301 (e.g., front plate 102 in FIG. 2) and the rear plate 302 (e.g., rear plate 111 in FIG. 2).

The first structure 331, the second structure 332, or the third structure 333 may indicate, for example, at least one component related to a corresponding function of the electronic device 300 and a set of elements related thereto. According to an embodiment (not shown), when viewed from above the rear plate 302, the first structure 331 may be disposed in a first component mounting space (or mounting region), the second structure 332 may be disposed in a second component mounting space, and the third structure 333 may be disposed in a third component mounting space. For example, the first component mounting space, the second component mounting space, or the third mounting space may be at least partially formed by the first support member 211 in FIG. 2. For example, the first component mounting space, the second component mounting space, or the third mounting space may be at least partially formed by the second support member 260 in FIG. 2. According to an embodiment, when viewed from above the rear plate 302, the second structure 332 may be disposed between the first structure 331 and the third structure 333. According to various embodiments, without being limited to the embodiment of FIG. 3, the electronic device 300 may include a variable number of component mounting spaces at different positions, and structures disposed therein.

According to an embodiment, the first structure 331 may include a substrate assembly (e.g., printed board assembly (PBA)) including at least one printed circuit board (PCB). The first structure 331 may include the PCB 240 in FIG. 2, and may include, for example, a first PCB (e.g., upper PCB), a second PCB (e.g., lower PCB), and an interposer substrate (middle substrate) between the first PCB and the second PCB. Various components such as a processor (e.g., application processor (AP)), a communication module, a charging module, a memory, or an interface may be mounted on the first structure 331.

According to an embodiment, the second structure 332 may include a battery (e.g., battery 250 in FIG. 2) electrically connected to the printed circuit board of the first structure 331. According to various embodiments, the second structure 332 may include various other components.

According to an embodiment, the third structure 333 may include an input and output assembly electrically connected to the printed circuit board of the first structure 331. For example, the input and output assembly may include various elements such as a speaker module, a PCB including a USB connector, a microphone module, or an antenna pattern. According to various embodiments, the third structure 333 may include various other components.

According to various embodiments, some of the second support member 260 in FIG. 2 may form at least a portion of the first structure 331, the second structure 332, or the third structure 333.

According to various embodiments (not shown), the electronic device 300 may include a first partition disposed between the first structure 331 and the second structure 332, or a second partition disposed between the second structure 332 and the third structure 333. The first partition or the second partition may be connected to, for example, the first support member 211 or the second support member 260 of FIG. 2, or may be integrally formed with the first support member 211 or the second support member 260.

According to an embodiment, the first structure 331 may include a first surface 3311 facing the rear plate 302. The second structure 332 may include a second surface 3321 facing the rear plate 302. The third structure 333 may include a third surface 3331 facing the rear plate 302. According to various embodiments, at least some of the first surface 3311, the second surface 3321, or the third surface 3331 may be substantially parallel to a flat outer surface 3021 formed by the rear plate 302 (e.g., flat surface included in the second surface 110B in FIG. 1B). According to a certain embodiment, at least some of the first surface 3311, the second surface 3321, or the third surface 3331 may be not parallel to the flat outer surface 3021, or may include a curved surface. According to various embodiments, a first distance (not shown) in which the first surface 3311 is spaced apart from the flat outer surface 3021, a second distance (not shown) at which the second surface 3321 is spaced apart from the flat outer surface 3021, and a third distance (not shown) at which the third surface 3431 is spaced apart from the flat outer surface 3021 may be different or substantially the same. For example, the first distance may be greater than the second distance or the third distance. According to various embodiments, in a direction 3001 in which the first structure 331, the second structure 332, and the third structure 333 are arranged, a first width (not shown) of the first surface 3311, a second width (not shown) of the second surface 3321, and a third width of the third surface 3331 may be different from each other. For example, the second width may be greater than the first width or the third width. For example, the first width may be greater than the third width.

The FPCB structure 304 may be extended from, for example, the first surface 3311 of the first structure 331 to the third surface 3331 of the third structure 333, and may include a plurality of layers. According to an embodiment, the FPCB structure 304 may include a flexible printed circuit board (FPCB) 310, a first layer 321, a second layer 322, a third layer 323, a fourth layer 324, a fifth layer 325, a sixth layer 326, or a seventh layer 327. Although not shown, an adhesive material (e.g., thermally conductive adhesive material) may be disposed between two layers bonded face-to-face. This bonding material may include various polymers capable of preventing separation of the two layers due to external impact. According to an embodiment, when viewed from above the rear plate 302, the FPCB 310 may at least partially overlap the second surface 3321 of the second structure 332. According to an embodiment, the FPCB 310 may include a plurality of conductive layers including a conductive pattern (e.g., copper pattern), and a plurality of non-conductive layers (e.g., insulating layers or dielectrics) alternately stacked with the plurality of conductive layers.

According to an embodiment, the FPCB 310 may include at least one antenna element. The at least one antenna element may be implemented with, for example, at least some of the plural conductive layers included in the FPCB 310. For example, the at least one antenna element included in the FPCB 310 may include an antenna element for NFC communication, an antenna element for wireless charging, and/or an antenna element for MST communication. According to an embodiment, the FPCB 310 may include at least one planar spiral coil (hereinafter, referred to as "planar coil") 312 disposed on a surface 311 facing the rear plate 302. According to various embodiments, the at least one planar coil 312 may be disposed close to the surface 311 inside the FPCB 310. According to various embodiments, the FPCB 310 may include the antenna 270 in FIG. 2.

According to an embodiment, when viewed from above the rear plate 302, the first layer 321 may include a first portion 3211 that at least partially overlaps the FPCB 310, and a second portion 3212 that is extended from the first portion 3211 to at least partially overlap the first surface 3311 of the first structure 331. According to an embodiment, when viewed from above the rear plate 302, the first layer 321 may include a fifth portion 3213 that is extended from the first portion 3211 to at least partially overlap the third surface 3331 of the third structure 333.

According to an embodiment, the second layer 322 and the fifth layer 325 may be disposed between the first layer 321 and the front plate 301, and may be bonded to the first layer 321. When viewed from above the rear plate 302, the second layer 322 may include a third portion 3221 that at least partially overlaps the second portion 3212 of the first layer 321, and a fourth portion 3222 that is extended from the third portion 3221 to partially overlap the first portion 3211 of the first layer 321. When viewed from above the rear plate 302, the fifth layer 325 may include a sixth portion 3251 that at least partially overlaps the fifth portion 3213 of the first layer 321, and a seventh portion 3252 that is extended from the sixth portion 3251 to partially overlap the first portion 3211 of the first layer 321.

According to an embodiment, the FPCB 310 may include a portion 317 in which the planar coil 312 is disposed and a remaining portion 316 except for the portion 317. The planar coil 312 may protrude toward the seventh layer 327 with respect to the surface 311 facing the seventh layer 327, and the portion 317 in which the planar coil 312 is disposed may have a greater thickness than the remaining portion 316.

According to an embodiment, when viewed from above the seventh layer 327, the second layer 322 may not overlap the portion 317 in which the planar coil 312 is disposed. When viewed from above the seventh layer 327, the fifth layer 325 may not overlap the portion 317 in which the planar coil 312 is disposed. Due to this, it is possible to reduce the difference between the thickness of the portion indicated by reference symbol 'A' and the thickness of the portion indicated by reference symbol 'B', or reduce the difference between the thickness of the portion indicated by reference symbol 'C' and the thickness of the portion indicated by reference symbol 'B'.

According to an embodiment, when the seventh layer 327 (e.g., sponge) is pressed by the rear plate 302, a part (not shown) of the first layer 321 may droop toward the second structure 332 between the second layer 322 and the fifth layer 325, so that it can be in physical contact with the second surface 3321 of the second structure 332. According to various embodiments, the first surface 3311 of the first structure 331 may be formed to be higher than the second surface 3321 of the second structure 332 in a direction in which the first surface 3311 faces. According to various embodiments, the difference in height between the first surface 3311 and the second surface 3321 can be made not to exceed the difference in thickness between the portion indicated by reference symbol 'A' and the portion indicated by reference symbol 'B'.

According to an embodiment, the third layer 323 may be disposed between the third portion 3221 of the second layer 322 and the first surface 3311 of the first structure 331 so as to attach or fix the third portion 3221 of the second layer 322 to the first surface 3311 of the first structure 331. According to an embodiment, the sixth layer 326 may be disposed between the sixth portion 3251 of the fifth layer 325 and the third surface 3331 of the third structure 333 so as to attach or fix the sixth portion 3251 of the fifth layer 325 to the third surface 3331 of the third structure 333. The third layer 323 or the sixth layer 326 may include various adhesive materials. For example, the third layer 323 or the sixth layer 326 may be an adhesive member based on PET. For example, the third layer 323 or the sixth layer 326 may include a thermally conductive material. According to various embodiments, the third layer 323 or the sixth layer 326 may be a photo-curable material that is hardened by light of a specific frequency band (e.g., ultraviolet rays).

According to an embodiment, when viewed from above the rear plate 302, the fourth layer 324 may be disposed between the FPCB 310 and the first layer 321, and may be formed at least along the FPCB 310. The fourth layer 324 may operate as a shielding element in wireless communication using a magnetic flux or magnetic field through the at least one planar coil 312 included in the FPCB 310. The fourth layer 324 (e.g., shielding sheet) may allow the magnetic flux from the planar coil 312 to be formed substantially toward the rear plate 302 rather than toward the front plate 301. The fourth layer 324 may be implemented in various ways, for example, in a form of a ferrite sheet, in a form of a magnetic sheet including a magnetic material such as a nano sheet, or in a form in which ferrite (or magnetic material) and a conductor sheet are bonded.

According to an embodiment, the thermally conductive first layer 321 may be not disposed between the FPCB 310 and the rear plate 302, or between the FPCB 310 and the fourth layer 324. Assuming that the first layer 321 is disposed between the FPCB 310 and the rear plate 302, or between the FPCB 310 and the fourth layer 324, the permittivity of the first layer 321 may affect the magnetic flux related to the planar coil 312.

According to an embodiment, the first layer 321 may include a soft thermally conductive material. For example, the first layer 321 may be implemented with a sheet coated with graphite. The first layer 321 may operate as a heat spreader to thereby prevent overheating of at least one component and dissipate heat so that heat is not concentrated in one place. Components included in the first structure 331, the second structure 332, or the third structure 333 may include resistive ingredients; when these components consume current, a portion of the current may be converted into thermal energy by the resistive ingredients and dissipated. These components may be distinguished from a component provided to intentionally dissipate heat.

According to an embodiment, heat released from the first structure 331 may be transferred to the first layer 321 through the second layer 322 and the third layer 323 and diffused in the first layer 321. Heat may transfer from the first layer 321 to the third structure 333 through the fifth layer 325 and the sixth layer 326. The heat released from the first structure 331 may be radiated in the first layer 321 and the third structure 333 to the surroundings through convective heat transfer, which is an energy transfer method between the solid surface and the gas.

According to various embodiments, due to conduction in which heat flows from the high temperature part to the low temperature part, heat may move in various paths. For example, heat radiated from the first structure 331 may move to the second structure 332 through the first layer 321. According to an embodiment, the seventh layer 327 may be disposed between the rear plate 302 and the FPCB 310 and may be implemented with a flexible member such as a sponge formed along at least some of the FPCB 310, protecting the FPCB 310. When the seventh layer 327 is pressed by the rear plate 302, some of the first portion 3211 of the first layer 321 may droop toward the front plate 301 between the second layer 322 and the fifth layer 325, so that it can be in physical contact with the second surface 3321 of the second structure 332. According to various embodiments, a thermally conductive material may be disposed between at least some of the first portion 3211 and the second surface 3321 of the second structure 332. The thermally conductive material between at least some of the first portion 3211 and the second surface 3321 of the second structure 332 may attach the first portion 3211 to the second surface 3321. As another example, heat released from the second structure 332 may move to the first layer 321 and diffuse at the first layer 321. As another example, heat released from the FPCB 310 (e.g., heat released from the planar coil 312) may move to the first layer 321 and diffuse at the first layer 321. As another example, heat released from the first structure 331, the second structure 332, or the third structure 333 may move to the fourth layer 324 and/or the FPCB 310 through the first layer 321. The fourth layer 324 or the conductive pattern included in the FPCB 310 may be utilized as a heat dissipation element. Various other heat transfer paths may be formed based on from the high temperature part to the low temperature part, and at least a portion of the first structure 331, the second structure 332, the third structure 333, or the FPCB structure 304 may be utilized as a heat dissipation element.

According to an embodiment, the second layer 322 and the fifth layer 325 may reduce damage to the soft first layer 321 from external impact caused by a drop or an external force. For example, assuming that the second portion 3212 of the first layer 321 is bonded to the first surface 3311 of the first structure 331 through the third layer 323 without the second layer 322, and the fifth portion 3213 of the first layer 321 is bonded to the third surface 3331 of the third structure 333 through the sixth layer 326 without the fifth layer 325, there may be a high possibility that the first layer 321 is damaged by external impact caused by a drop. Although elements such as the first structure 331, the second structure 332, and the third structure 333 are coupled to each other, as these elements have different masses (or centers of mass) or weights, when external impact occurs due to a fall or external force, shaking, flow, or vibration may occur at each element. The elements may be formed in consideration of tolerance, and this tolerance may be involved in shaking, flow, or vibration of each element as to external impact. In response to external impact, it may be difficult for the elements to have the same translational motion; e.g., they may move (e.g., shake, flow, or vibrate) in different directions or different displacements. For this reason, due to external impact, the first layer 321 may be damaged at a first position 3051 corresponding to a first boundary portion 305 or at a second position 3061 corresponding to a second boundary portion 306 between the second structure 332 and the third structure 333. For example, if the first structure 331 and the third structure 333 do not have translational motion as to external impact, the second portion 3212 of the first layer 321 is directly fixed to the first structure 331, and the fifth portion 3213 of the first layer 321 is fixed directly to the third structure 333, a stress causing damage (e.g., fracture) can occur at the first position 3051 corresponding to the first boundary portion 305 or at the second position 3061 corresponding to the second boundary portion 306. For example, a stress due to external impact may be concentrated at the first position 3051 between the overlapping section of the FPCB 310 and the first layer 321, which have different physical properties (e.g., tensile strength), and the non-overlapping section thereof. A stress due to external impact may be concentrated at the second position 3061 between the overlapping section of the FPCB 310 and the fifth layer 325, which have different physical properties (e.g., tensile strength), and the non-overlapping section thereof.

According to an embodiment, the second layer 322 and the fifth layer 325 may be made of a material having a greater tensile strength than the first layer 321. For example, as to an external force under the same condition, the material of the first layer 321 may be fractured, but the material of the second layer 322 and the material of the fifth layer 325 may elastically withstand it without fracture. According to various embodiments, the second layer 322 and the fifth layer 325 may be implemented with a soft polymer having elasticity so as not to be fractured due to external impact caused by a fall or an external force. According to an embodiment, the second layer 322 or the fifth layer 325 may include engineering plastic. Engineering plastic is plastic having various properties, such as strength, elasticity, impact resistance, abrasion resistance, and electrical insulation, and may be diverse such as polyethylene terephthalate (PET), polybutylene terephthalate (PBT), polyamide, polyimide, and polycarbonate. According to an embodiment, the second layer 322 or the fifth layer 325 may include PET. According to an embodiment, the structure in which the thermally conductive first layer 321 is disposed between the second layer 322 and the FPCB 310 while leaving a partially overlapping section of the second layer 322 and the FPCB 310 (e.g., refer to the fourth portion 3222 of the second layer 322) may prevent stress due to external impact from being concentrated at the first position 3051 and distribute it over the second layer 322. According to an embodiment, the structure in which the thermally conductive first layer 321 is disposed between the fifth layer 325 and the FPCB 310 while leaving a partially overlapping section of the fifth layer 325 and the FPCB 310 (e.g., refer to the seventh portion 3252 of the fifth layer 325) may prevent stress due to external impact from being concentrated at the first position 3051 and distribute it over the fifth layer 325.

According to an embodiment, when viewed from above the rear plate 302, the third layer 323 may be disposed between the first structure 331 and the third portion 3221 of the second layer 322, and may be not extended beyond the first position 3051 or the first boundary portion 305 to overlap the first portion 3211 of the first layer 321. The third layer 323 may determine a stress region exerted on the second layer 322 due to external impact caused by a drop or an external force. The third layer 323 may determine a boundary 3052 at which stress occurs in the second layer 322 due to external impact. When assuming that the third layer 323 is extended beyond the first position 3051 or the first boundary portion 305 to overlap the first portion 3211 of the first layer 321, both the first structure 331 and the second structure 332 are joined to the FPCB structure 304 by the third layer 323, and the first layer 321 may be damaged due to shaking or vibration of each of the first structure 331 and the second structure 332 in case of external impact.

According to an embodiment, when viewed from above the rear plate 302, the sixth layer 326 may be disposed between the third structure 333 and the sixth portion 3251 of the fifth layer 325, and may be not extended beyond the second position 3061 or the second boundary portion 306 to overlap the first portion 3211 of the first layer 321. The sixth layer 326 may determine a stress region exerted on the fifth layer 325 due to external impact caused by a drop or an external force. The sixth layer 326 may determine a boundary 3062 at which stress occurs in the fifth layer 325 due to external impact. When assuming that the sixth layer 326 is extended beyond the second position 3061 or the second boundary portion 306 to overlap the first portion 3211 of the first layer 321, both the third structure 333 and the second structure 332 are joined to the FPCB structure 304 by the sixth layer 326, and the first layer 321 may be damaged due to shaking or vibration of each of the third structure 333 and the second structure 332 in case of external impact.

According to an embodiment, the FPCB 310 may include a soft part such as polyimide and a hard part such as a conductive pattern (copper pattern), but the tensile strength of the FPCB 310 is influenced by the conductive pattern and it may have a rigid property. Further, as the boundary between the soft part and the hard part of the FPCB 310 is a portion where different physical properties come into contact, stress may be concentrated on the boundary in case of external impact, and the soft part and the hard part may be delaminated from each other. For this reason, as to an external force of the same condition, the material of the FPCB 310 may be damaged, but the material of the second layer 322 or the material of the fifth layer 325 may elastically withstand it without damage. Thus, even if the FPCB 310 is expanded to overlap the second portion 3212 of the first layer 321 or the fifth portion 3213 without the second layer 322 or the fifth layer 325, due to external impact caused by a drop or an external force, the FPCB 310 may be damaged or the first layer 321 may be damaged without being supported by the expanded portion of the FPCB 310. Further, when the FPCB 310 is expanded to overlap the second portion 3212 of the first layer 321 or the fifth portion 3213 without the second layer 322 or the fifth layer 325, the conductive pattern included in the expanded portion of the FPCB 310 may cause deterioration of radiation performance of a nearby antenna. The second layer 322 and the fifth layer 325 according to an embodiment may overcome these limitations of the FPCB 310, and prevent the damage of the first layer 321 due to external impact caused by a drop or an external force. In addition, the second layer 322 and the fifth layer 325 may reduce costs compared to when the FPCB 310 is expanded.

Figure 4A:
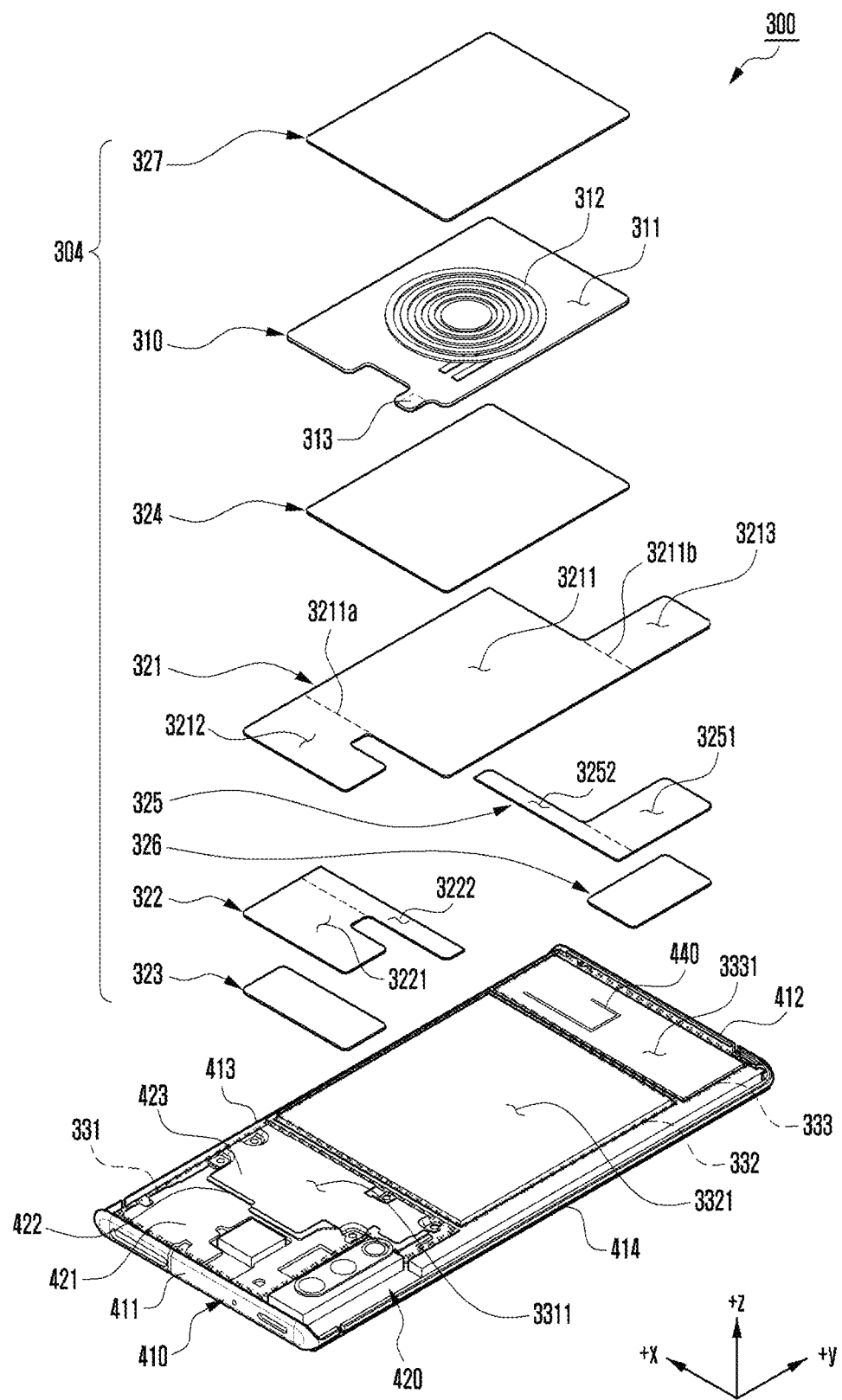
FIG. 4A illustrates an exploded perspective view of the electronic device of FIG. 3 according to an embodiment of this disclosure.
Figure 4B:
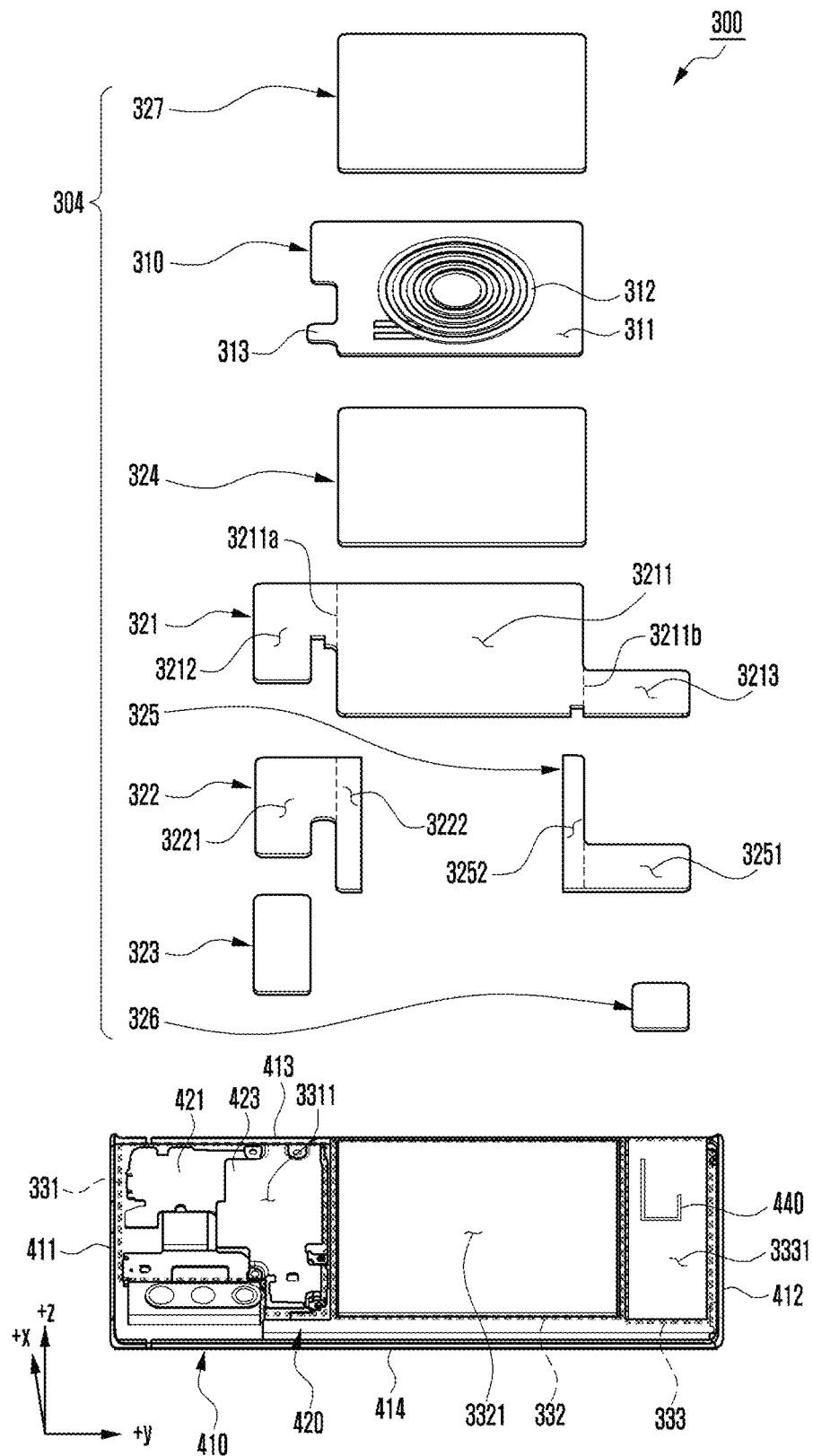
FIG. 4B illustrates an exploded perspective view of the electronic device viewed from a direction different from that of FIG. 4A according to an embodiment of this disclosure.
Figure 4C:
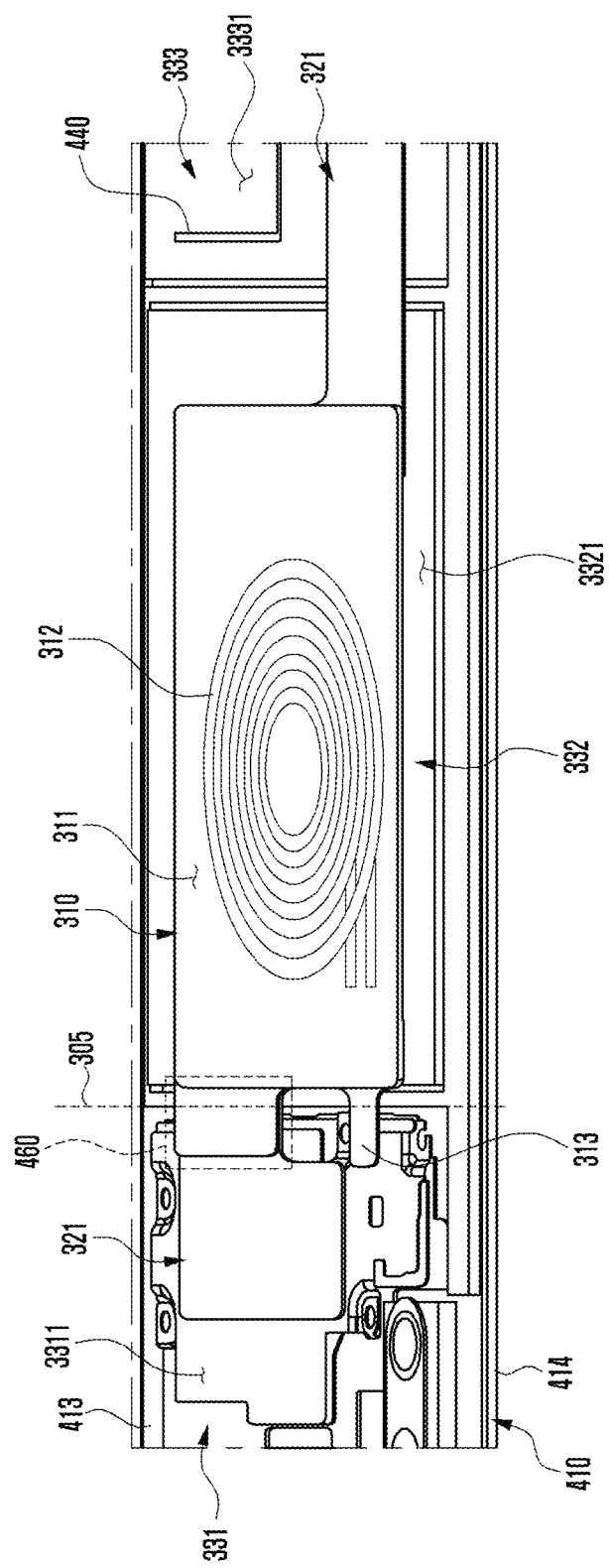
FIG. 4C illustrates a perspective view of the electronic device according to an embodiment of this disclosure.

FIG. 4A illustrates an exploded perspective view of the electronic device 300 of FIG. 3 according to an embodiment of this disclosure. FIG. 4B illustrates an exploded perspective view of the electronic device 300 viewed from a direction different from that of FIG. 4A according to an embodiment of this disclosure. FIG. 4C illustrates a perspective view of the electronic device 300 according to an embodiment of this disclosure.

At least one of the components of the electronic device 300 in FIGS. 4A, 4B and 4C may be the same as or similar to at least one of the components of the electronic device 300 in FIG. 3, and a repeated description thereof will be omitted below.

With reference to FIGS. 4A, 4B and 4C, in one embodiment, the electronic device 300 may include a side member 410, a support member 420, a first structure 331, a second structure 332, a third structure 333, or an FPCB structure 304.

According to an embodiment, the side member 410 (e.g., side bezel structure 118 in FIG. 2) may form the side surface (e.g., side surface 110C in FIG. 2) of the electronic device 300, and may include a first side part 411, a second side part 412, a third side part 413, or a fourth side part 414. The first side part 411 may be disposed on the opposite side to the second side part 412, and may be substantially parallel to the second side part 412. The third side part 413 may connect one end (not shown) of the first side part 411 and one end (not shown) of the second side part 412. The fourth side part 414 may connect the other end (not shown) of the first side part 411 and the other end (not shown) of the second side part 412. The fourth side part 414 may be disposed on the opposite side to the third side part 413, and may be substantially parallel to the third side part 413.

According to an embodiment, the support member 420 (e.g., first support member 211 in FIG. 2) may be disposed inside the side member 410, and may be connected to the side member 410 or integrally formed with the side member 410. According to an embodiment, the first structure 331 may be disposed in a first component mounting space (not shown) formed in the support member 420, the second structure 332 may be disposed in a second component mounting space (not shown) formed in the support member 420, and the third structure 333 may be disposed in a third component mounting space (not shown) formed in the support member 420. When viewed from above the rear plate (e.g., rear plate 302 in FIG. 3) (hereinafter, when viewed in the negative z-axis direction), the first structure 331 may be disposed between the first side part 411, a portion of the third side part 413, and a portion of the fourth side part 414. The third structure 333 may be disposed between the second side part 412, a portion of the third side part 413, and a portion of the fourth side part 414. When viewed in the negative z-axis direction, the second structure 332 may be disposed between the first structure 331 and the third structure 333.

According to an embodiment, the first structure 331 may include a substrate assembly. For example, when viewed in the negative z-axis direction, the first structure 331 as a substrate assembly may include a first PCB (e.g., main PCB) 421, a second PCB (e.g., slave PCB) 422 disposed to partially overlap the first PCB 421, or a shielding member 423 (e.g., shield can) that at least partially covers the second PCB 422. Although not shown, an interposer substrate may be disposed between the first PCB 421 and the second PCB 422, and the interposer substrate may connect the first PCB 421 and the second PCB 422 and may be a path of a signal flow.

According to an embodiment, the second structure 332 may be a battery. According to various embodiments, the second structure 332 may further include components other than the battery.

According to an embodiment, the third structure 333 may include an input and output assembly. For example, the input and output assembly may include various elements such as a speaker module, a PCB including a USB connector, a microphone module, or an antenna pattern 440. For example, the third structure 333 may include the antenna pattern 440 disposed on the third surface 3331 to which the sixth layer 326 is attached. According to an embodiment, the antenna pattern 440 may be implemented with laser direct structuring (LDS). For example, the antenna pattern 440 may be formed by designing a pattern on the third surface 3331 of the structure made of a non-conductive resin by use of a laser and plating a conductive material such as copper or nickel thereon. According to various embodiments, the third structure 333 may include various other components such as a microphone and a connector.

According to an embodiment, the FPCB structure 304 may include an FPCB 310, a first layer 321, a second layer 322, a third layer 323, a fourth layer 324, a fifth layer 325, a sixth layer 326, or a seventh layer 327.

According to an embodiment, the FPCB 310 may include a planar coil 312 and a connector part 313. The planar coil 312 may be disposed on a surface 311 facing the seventh layer 327, and the connector part 313 may be electrically connected to the planar coil 312. The connector part 313 may refer to, for example, a portion including a connector (e.g., FPCB connector) disposed on a surface on the opposite side to the surface 311 on which the planar coil 312 is disposed. The connector part 313 may partially overlap the first structure 331 when viewed in the negative z-axis direction. The connector part 313 may be electrically connected to a connector (not shown) formed in the first structure 331. According to various embodiments, the connector part 313 may be electrically connected to a copper foil pad or land formed in the first structure 331, instead of a connector, through a conductive bonding member such as solder. The communication module included in the first structure 331 may perform NFC communication and/or MST communication through the planar coil 312. The wireless charging module included in the first structure 331 may, through the planar coil 312, receive a wireless charging signal from an external device or transmit a wireless charging signal to an external device.

According to an embodiment, the first layer 321 may include a thermally conductive material such as graphite. When viewed in the negative z-axis direction, the first layer 321 may include a first portion 3211 overlapping at least with the FPCB 310, a second portion 3212 disposed on both sides with the first portion 3211 interposed therebetween, and a fifth portion 3213. According to an embodiment, when viewed in the negative z-axis direction, the first portion 3211 may be rectangular, the second portion 3212 may extend from a portion of a first edge 3211a of the first portion 3211, and the fifth portion 3213 may extend from a portion of the second edge 3211b. The first edge 3211a and the second edge 3211b may be disposed on the opposite sides and be parallel to each other. According to various embodiments (not shown), the first edge 3211a and the second edge 3211b may be not parallel to each other.

According to an embodiment, when viewed in the negative z-axis direction, in the first layer 321, the second portion 3212 and the fifth portion 3213 may be dissymmetrical with respect to the first portion 3211. For example, when viewed in the negative z-axis direction, the second portion 3212 and the fifth portion 3213 may be formed in different shapes or sizes. For example, when viewed in the negative z-axis direction, the second portion 3212 may be disposed closer to the third side part 413 among the third side part 413 and the fourth side part 414 of the side member 410. For example, when viewed in the negative z-axis direction, the fifth portion 3213 may be disposed closer to the fourth side part 414 among the third side part 413 and the fourth side part 414 of the side member 410.

According to an embodiment, the fourth layer 324 may be disposed between the FPCB 310 and the first layer 321, and may include a shielding material (or, magnetic material) such as ferrite, which is involved in the magnetic flux or radio frequency associated with the planar coil 312 of the FPCB 310. According to an embodiment, when viewed in the negative z-axis direction, the fourth layer 324 may be a rectangle overlapping the FPCB 310. According to various embodiments, the fourth layer 324 may be implemented in various other shapes according to the form of the FPCB 310.

According to an embodiment, the second layer 322 may include a third portion 3221 disposed between the first structure 331 and the first layer 321. When viewed in the negative z-axis direction, the third portion 3221 may be bonded with at least a partial overlap to the first surface 3311 of the first structure 331. When viewed in the negative z-axis direction, the second layer 322 may include a fourth portion 3222 that extends from the third portion 3221 and is bonded with a partial overlap to the first portion 3211 of the first layer 321.

According to an embodiment, the fifth layer 325 may include a sixth portion 3251 disposed between the third structure 333 and the first layer 321, and the sixth portion 3251 may be bonded with at least a partial overlap to the third surface 3331 of the third structure 333 when viewed in the negative z-axis direction. When viewed in the negative z-axis direction, the fifth layer 325 may include a seventh portion 3252 that extends from the sixth portion 3251 and is bonded with a partial overlap to the first portion 3211 of the first layer 321.

According to an embodiment, the third layer 323 may bond the third portion 3221 of the second layer 322 and the first surface 3311 of the first structure 331. The fifth layer 325 may bond the sixth portion 3251 of the fifth layer 325 and the third surface 3331 of the third structure 333.

According to an embodiment, the second layer 322 and the fifth layer 325 may be made of various polymers having tensile strength and elasticity to withstand external impact in order to reduce the damage of the first layer 321 from external impact caused by a fall or an external force. The first structure 331 bonded to the second portion 3212 of the first layer 321 through the third layer 323, the third structure 333 bonded to the fifth portion 3213 of the first layer 321 through the sixth layer 326, and the second structure 332 may be shaken by external impact caused by a fall or an external force. When viewed in the negative z-axis direction, the second layer 322 and the fifth layer 325 may overlap at least partially with the first portion 3211 of the first layer 321, which can reduce transmission of external impact to the first layer 321.

According to various embodiments, as the connector part 313 of the FPCB 310 is electrically connected to the first structure 331, when the first structure 331 shakes or vibrates due to external impact caused by a fall or an external force, the connector part 313 may be affected by such shaking or vibration. According to an embodiment, since the FPCB structure 304 is fixed to the first structure 331 and the third structure 333, it is possible to reduce stress in the connector part 313 due to external impact. According to an embodiment, the second layer 322 and the fifth layer 325 may prevent stress due to external impact from being concentrated at the connector part 313.

With reference to FIG. 4C, according to an embodiment, the FPCB structure 304 may include a middle portion 460 that crosses the first boundary portion 305 between the first structure 331 and the second structure 332. According to an embodiment, the middle portion 460 may have a relatively narrow width extended in a direction from the third side part 413 to the fourth side part 414. The middle portion 460 may include the second layer 322 and at least one layer bonded thereto. The connector part 313 of the FPCB 310 may be disposed to cross the first boundary portion 305 while being spaced apart from the middle portion 460. Since the middle portion 460 is fixed to the first structure 331 through the third layer 323 and has a width extended in a direction from the third side part 413 of the side member 410 to the fourth side part 414 and a thickness in a direction toward the rear plate 302 in FIG. 3, it can prevent stress due to external impact from being concentrated at the connector part 313. According to various embodiments, the width or thickness of the middle portion 460 may be modified in various ways, without being limited to the example shown in FIG. 4, to reduce the influence of external impact caused by a drop or an external force on the middle portion 460 and/or the connector part 313. According to various embodiments, by varying the distance at which the connector part 313 is spaced apart from the middle portion 460, the influence of external impact on the middle portion 460 and/or the connector part 313 may be reduced.

According to various embodiments, when viewed in the negative z-axis direction, the second layer 322 and the fifth layer 325 may be dissymmetric to each other, and the area of a first junction by the third layer 323 between the second layer 322 and the first structure 331 may be different from the area of a second junction by the sixth layer 326 between the fifth layer 325 and the third structure 333. For example, the area of the first junction may be greater than that of the second junction, and a greater stress may be generated at the second junction than at the first junction in case of external impact due to a fall or an external force.

According to an embodiment, the second layer 322 may be made of the same material as the fifth layer 325.

According to various embodiments, the second layer 322 may be made of a material different from that of the fifth layer 325. According to various embodiments, the second layer 322 may be implemented to be more resilient and have a greater tensile strength than the fifth layer 325. According to a certain embodiment, the fifth layer 325 may be implemented to be more resilient and have a greater tensile strength than the second layer 322.

Figure 5:
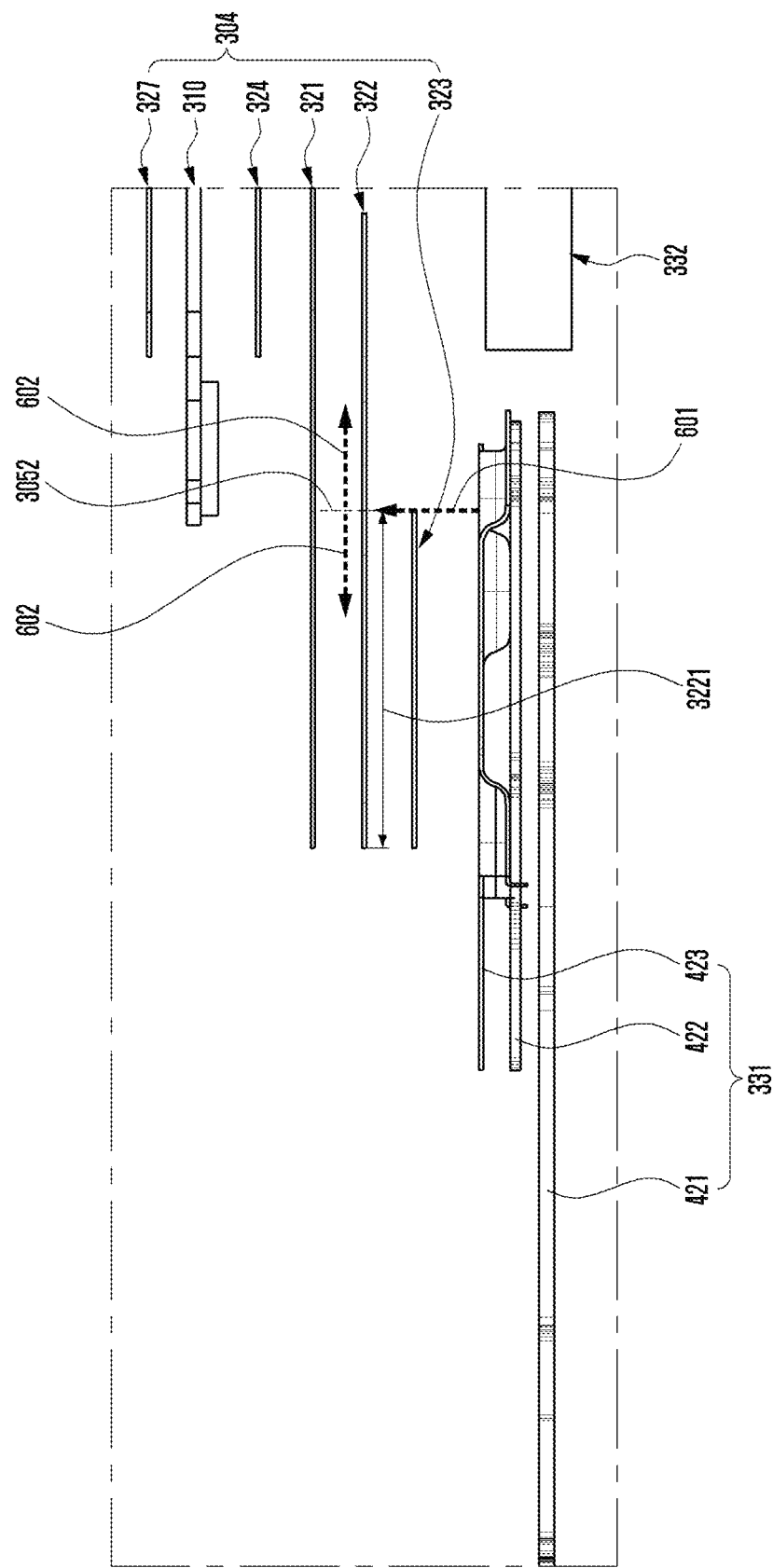
FIG. 5 illustrates an exploded perspective view of the FPCB structure according to an embodiment of this disclosure.

FIG. 5 illustrates an exploded perspective view of the FPCB structure 304 according to an embodiment of this disclosure.

With reference to FIG. 5, the FPCB structure 304 according to an embodiment may include an FPCB 310, a first layer 321, a second layer 322, a third layer 323, a fourth layer 324, a fifth layer 325, a sixth layer 326, or a seventh layer 327. Repeated descriptions on some of the reference symbols in FIG. 5 will be omitted.

According to an embodiment, when viewed from above the seventh layer 327, the third layer 323 may be disposed between the first structure 331 and the third portion 3221 of the second layer 322 and may be not extended to overlap the second structure 332. The third layer 323 may determine a stress region exerted on the second layer 322 due to external impact caused by a drop or an external force. For example, the third layer 323 may determine a boundary 3052 at which stress occurs in the second layer 322 due to external impact. The boundary 3052 may be between an overlapping section of the third layer 323 and the second layer 322 and a non-overlapping section thereof. The second layer 322 may be made of a material that is more resilient and has a greater tensile strength compared with the first layer 321. As to an external force under the same condition, the material of the first layer 321 may be fractured, but the material of the second layer 322 may elastically withstand it without fracture. According to an embodiment, the structure in which the thermally conductive first layer 321 is disposed between the second layer 322 and the FPCB 310 while leaving a partially overlapping section of the second layer 322 and the FPCB 310 may reduce transmission of external impact to the first layer 321. For example, stress due to external impact may be concentrated at the boundary 3052 (601), but the stress may be distributed over the second layer 322 being more elastic and having a greater tensile strength than that of the first layer 321 (602). Although not shown, the fifth layer 325 and the structure related thereto may also prevent damage to the first layer 321.

Figure 6:
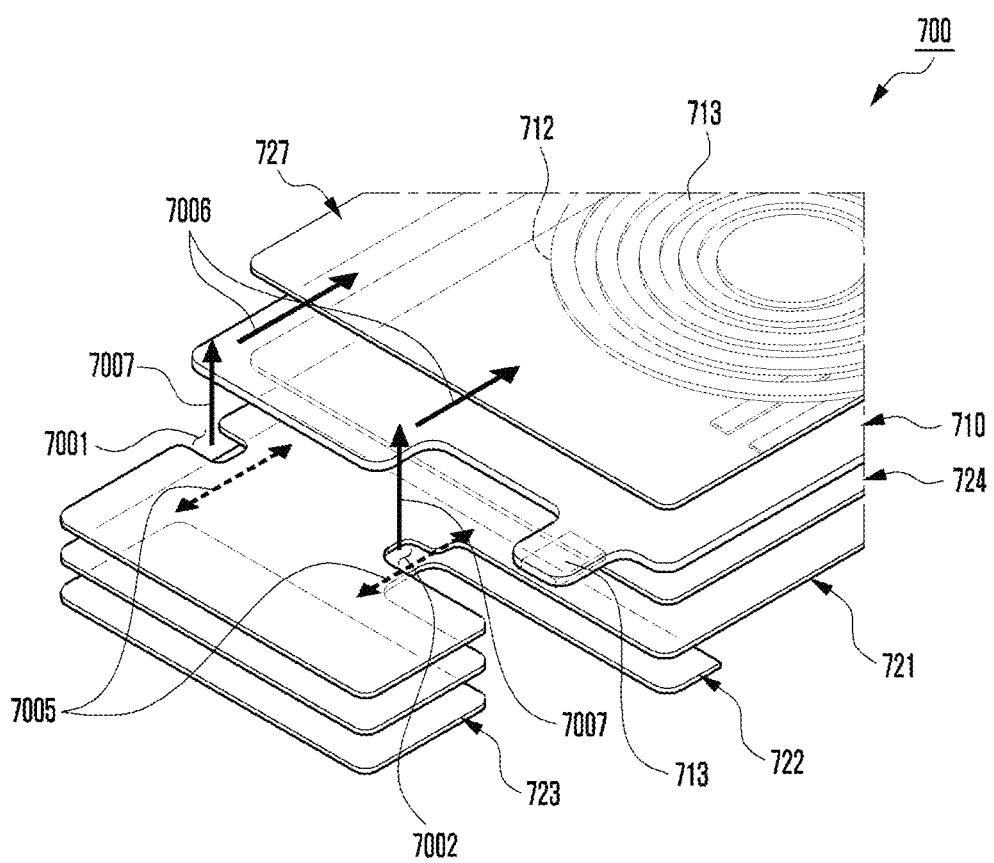
FIG. 6 illustrates an exploded perspective view of the FPCB structure according to various embodiments of this disclosure.
Figure 7:
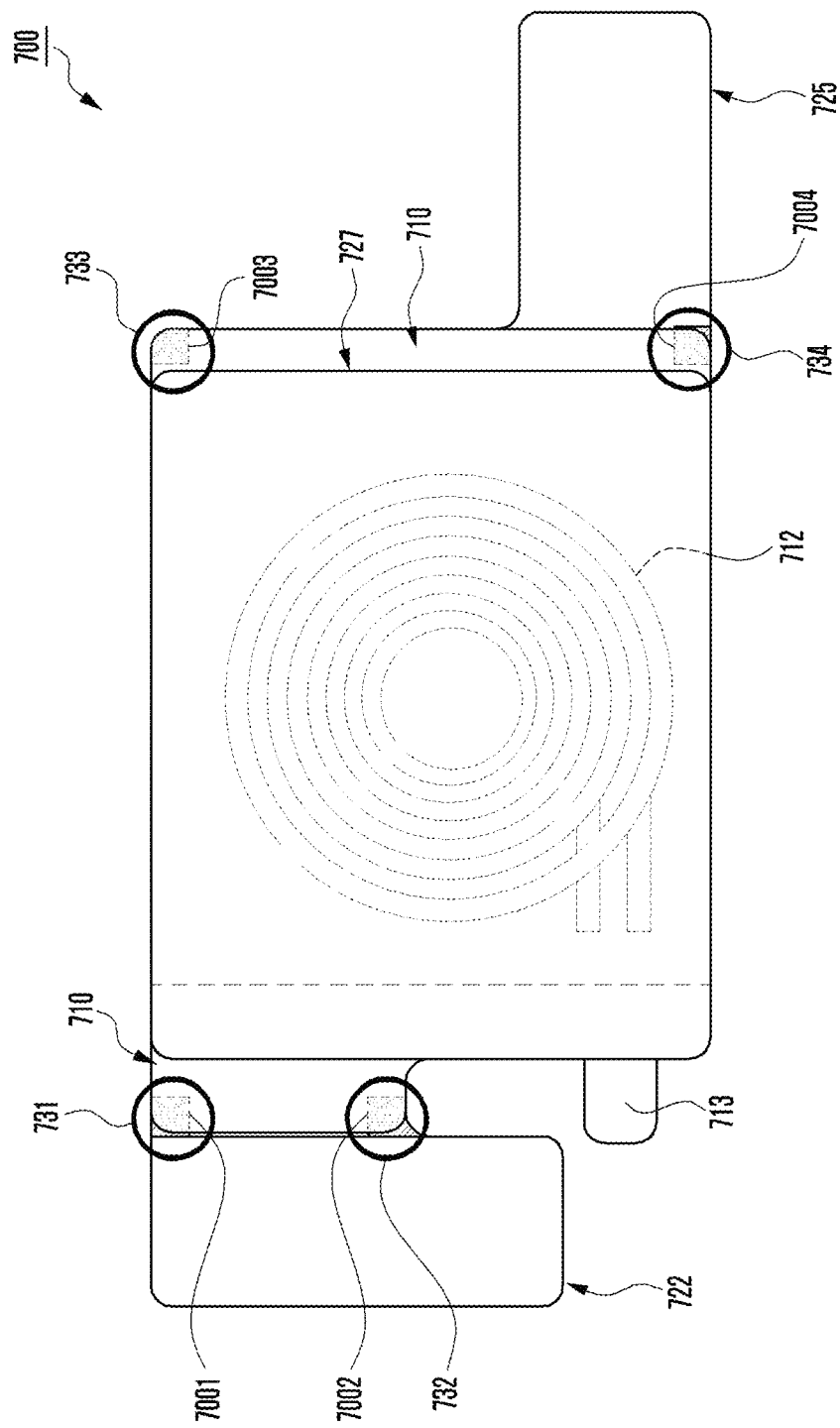
FIG. 7 illustrates a plan view of the FPCB structure of FIG. 6 according to an embodiment of this disclosure.

FIG. 6 illustrates an exploded perspective view of the FPCB structure 700 according to various embodiments of this disclosure. FIG. 7 illustrates a plan view of the FPCB structure 700 of FIG. 6 according to an embodiment of this disclosure.

With reference to FIG. 6, in one embodiment, the FPCB structure 700 may include an FPCB 710, a first layer 721, a second layer 722, a third layer 723, or a fourth layer 724. The FPCB 710 may include a planar coil 712 (e.g., planar coil 312 in FIG. 4A) and a connector part 713 (e.g., connector part 313 in FIG. 4A), and may be substantially the same as the FPCB 310 in FIG. 4A. The second layer 722 may be substantially the same as the second layer 322 in FIG. 4A. The third layer 723 may be substantially the same as the third layer 323 in FIG. 4A. The fourth layer 724 may be substantially the same as the fourth layer 324 in FIG. 4A.

According to an embodiment, when viewed from above the seventh layer 727, the first layer 721 including a thermally conductive material such as graphite may include a plurality of openings 7001 and 7002 formed between the second layer 722 and the FPCB 710. According to an embodiment, the plurality of openings 7001 and 7002 may be formed in the middle portion 460 in FIG. 4C. With reference to FIGS. 4C and 6, one opening 7001 may be in the form of a notch recessed in a direction from the third side part 413 of the side member 410 to the fourth side part 414. With reference to FIGS. 4C and 6, the other opening 7002 (notch) may be in the form of a notch recessed in a direction from the fourth side part 414 of the side member 410 to the third side part 413.

According to an embodiment, the FPCB 710 and the second layer 722 may be bonded to each other through various adhesive materials in the plural openings 7001 and 7002 of the first layer 721. According to various embodiments, the shape, number, or location of the openings may vary without being limited to FIG. 6.

With reference to FIG. 7, when viewed from above the seventh layer 727, a plurality of openings 7001, 7002, 7003 and 7004 formed in the first layer 721 may be formed in correspondence to a plurality of corners 731, 732, 733 and 734 of the FPCB 710. A plurality of corners 731 and 732 may be bonded to the second layer 722 through a plurality of openings 7001 and 7002, and a plurality of corners 733 and 734 may be bonded to the fifth layer 725 through a plurality of openings 7003 and 7004. According to an embodiment, the plurality of openings 7001 and 7002 may be disposed in correspondence to the first boundary portion 305 between the first structure 331 and the second structure 332 in FIG. 3. According to an embodiment, the plurality of openings 7003 and 7004 may be disposed in correspondence to the second boundary portion 306 between the second structure 332 and the third structure 334 in FIG. 3. The structure in which the FPCB 710 is directly bonded to the second layer 722 and/or the fifth layer 725 at different positions through the plurality of openings 7001, 7002, 7003 and 7004 may allow external impact caused by a drop or an external force to be dispersed or absorbed in the second layer 722 and the fifth layer 725 (refer to reference symbol '7005'), and/or may transfer the external impact to the FPCB 710 (refer to reference symbol '7007') to be dispersed (refer to reference symbol '7006') or absorbed in the FPCB 710. Thereby, it is possible to reduce the transmission of external impact to the first layer 721.

Figure 8A:
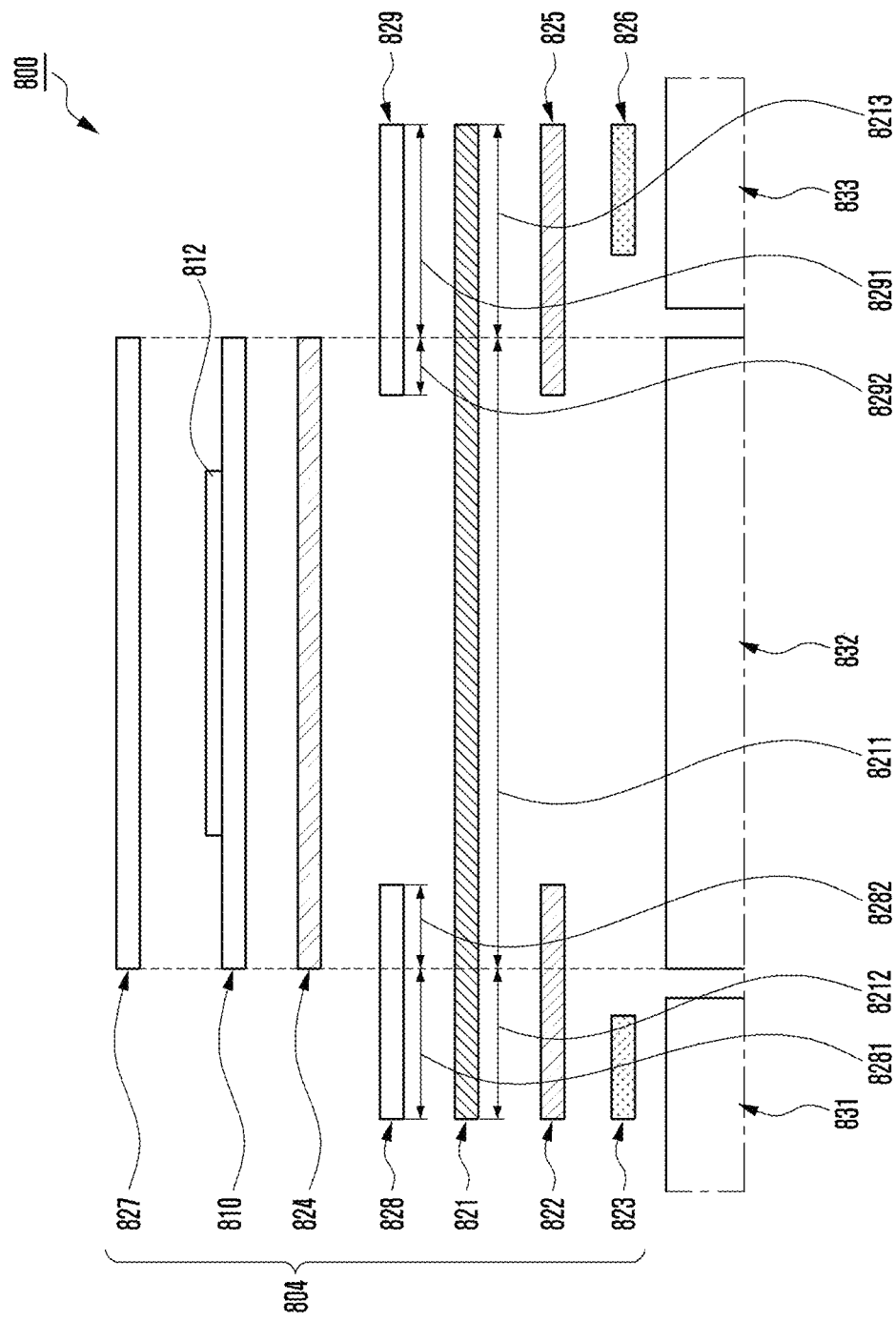
FIG. 8A illustrates an exploded cross-sectional view of the FPCB structure in the electronic device according to various embodiments of this disclosure.
Figure 8B:
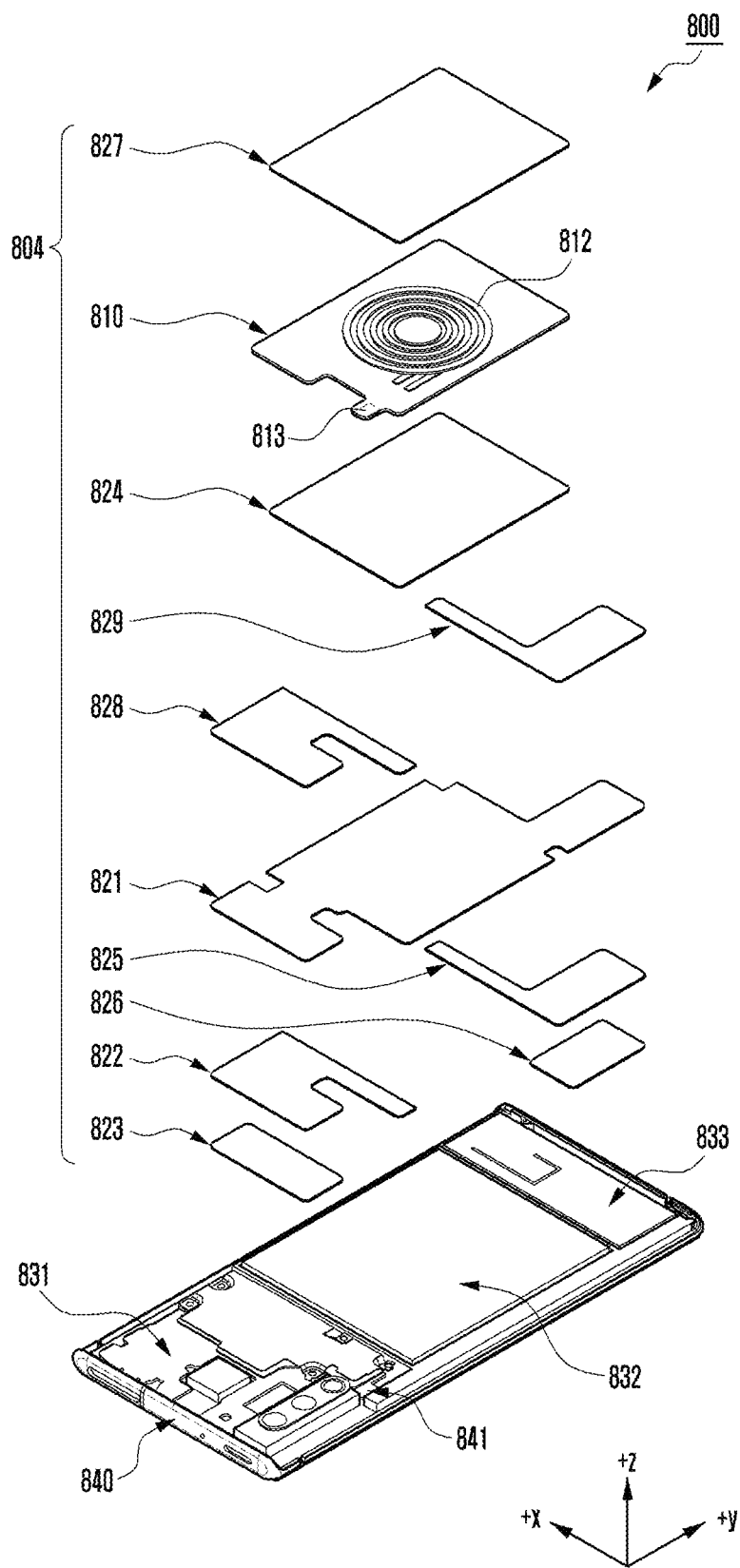
FIG. 8B illustrates an exploded perspective view of the electronic device of FIG. 8A according to an embodiment of this disclosure.

FIG. 8A illustrates an exploded cross-sectional view of the FPCB structure 804 in the electronic device 800 according to various embodiments of this disclosure. FIG. 8B illustrates an exploded perspective view of the electronic device 800 of FIG. 8A according to an embodiment of this disclosure.

With reference to FIGS. 8A and 8B, in one embodiment, the electronic device 800 (e.g., electronic device 100 in FIG. 2) may include a side member 840, a support member 841, an FPCB structure 804, a first structure 831, a second structure 832, or a third structure 833. The side member 840 may be the side member 410 in FIG. 4A, and the support member 841 may be the support member 420 in FIG. 4A. The first structure 831 may be the first structure 331 in FIG. 3 or 4A. The second structure 832 may be the second structure 332 in FIG. 3 or 4A. The third structure 833 may be the third structure 333 in FIG. 3 or 4A. The FPCB structure 804 may be disposed across from the first structure 831 to the third structure 833, may be bonded to the first structure 831 through the third layer 823 (e.g., third layer 323 in FIG. 3 or 4A), and may be bonded to the third structure 833 through the sixth layer 826 (e.g., sixth layer 326 in FIG. 3 or 4A).

According to an embodiment, the FPCB structure 804 may include an FPCB 810 including at least one planar coil 812, a first layer 821, a second layer 822, a third layer 823, a fourth layer 824, a fifth layer 825, a sixth layer 826, a seventh layer 827, an eighth layer 828, or a ninth layer 829. Although not shown, an adhesive material (e.g., thermally conductive adhesive material) may be disposed between two layers bonded face-to-face. This bonding material may include various polymers capable of preventing separation of the two layers due to external impact. The FPCB 810 may be the FPCB 310 including the planar coil 312 in FIG. 3 or 4A. The first layer 821 may be the thermally conductive first layer 321 in FIG. 3 or 4A. The second layer 822 may be more resilient and have a greater tensile strength than the first layer 821, and may be, for example, the second layer 322 in FIG. 3 or 4A. The fifth layer 825 may be more resilient and have a greater tensile strength than the first layer 821, and may be, for example, the fifth layer 325 in FIG. 3 or 4A. The third layer 823 may include an adhesive material for bonding the second layer 822 and the first structure 831, and may be, for example, the third layer 323 in FIG. 3 or 4A. The fourth layer 824 may be the fourth layer 324 in FIG. 3 or 4A. The sixth layer 826 may include an adhesive material for bonding the fifth layer 825 and the third structure 833, and may be, for example, the sixth layer 326 in FIG. 3 or 4A. The seventh layer 827 may be the seventh layer 327 in FIG. 3 or 4A. The FPCB structure 804 according to the embodiment of FIG. 8A or 8B may further include the eighth layer 828 and the ninth layer 829 compared to the FPCB structure 304 according to the embodiment of FIG. 3 or 4A.

According to an embodiment, when viewed from above the FPCB 810, the eighth layer 828 may be formed to follow the second layer 822, and may be disposed on the opposite side to the second layer 822 with the first layer 821 interposed therebetween. When viewed from above the FPCB 810, the eighth layer 828 may include an eighth portion 8281 overlapping the second portion 8212 of the first layer 821 (e.g., second portion 3212 in FIG. 3 or 4A), and a ninth portion 8282 extending between the FPCB 810 and the first layer 821 from the eighth portion 8281.

According to an embodiment, when viewed from above the FPCB 810, the ninth layer 829 may be formed to follow the fifth layer 825, and may be disposed on the opposite side to the second layer 825 with the first layer 821 interposed therebetween. When viewed from above the FPCB 810, the ninth layer 829 may include a tenth portion 8291 overlapping the fifth portion 8213 of the first layer 821 (e.g., fifth portion 3213 in FIG. 3 or 4A), and an eleventh portion 8292 extending between the FPCB 810 and the first layer 821 from the tenth portion 8291.

According to an embodiment, the eighth layer 828 and the ninth layer 829 may be more resilient and have a greater tensile strength than the first layer 821. According to various embodiments, the eighth layer 828 may include the same material as the second layer 822, and the ninth layer 829 may include the same material as the fifth layer 825. The eighth layer 828 and the ninth layer 829, together with the second layer 822 and the fifth layer 825, may reduce the transmission of external impact caused by a drop or an external force to the first layer 821. For example, the eighth layer 828 and the ninth layer 829, together with the second layer 822 and the fifth layer 825, may disperse or absorb external impact caused by a drop or an external force. For example, the eighth layer 828 and the ninth layer 829, together with the second layer 822 and the fifth layer 825, may transfer external impact caused by a drop or an external force to the FPCB 810.

According to an embodiment, heat released from the first structure 831 may move through the second layer 822 and the third layer 823 to the first layer 821, and may be diffused over the first layer 821. Heat may move from the first layer 821 to the third structure 833 through the fifth layer 825 and the sixth layer 826. Based on from the high temperature part to the low temperature part, various other heat movement paths may be formed; and at least a portion of the first structure 831, the second structure 832, the third structure 833, or the FPCB structure 804 may be utilized as a heat dissipation element.

Figure 9B:
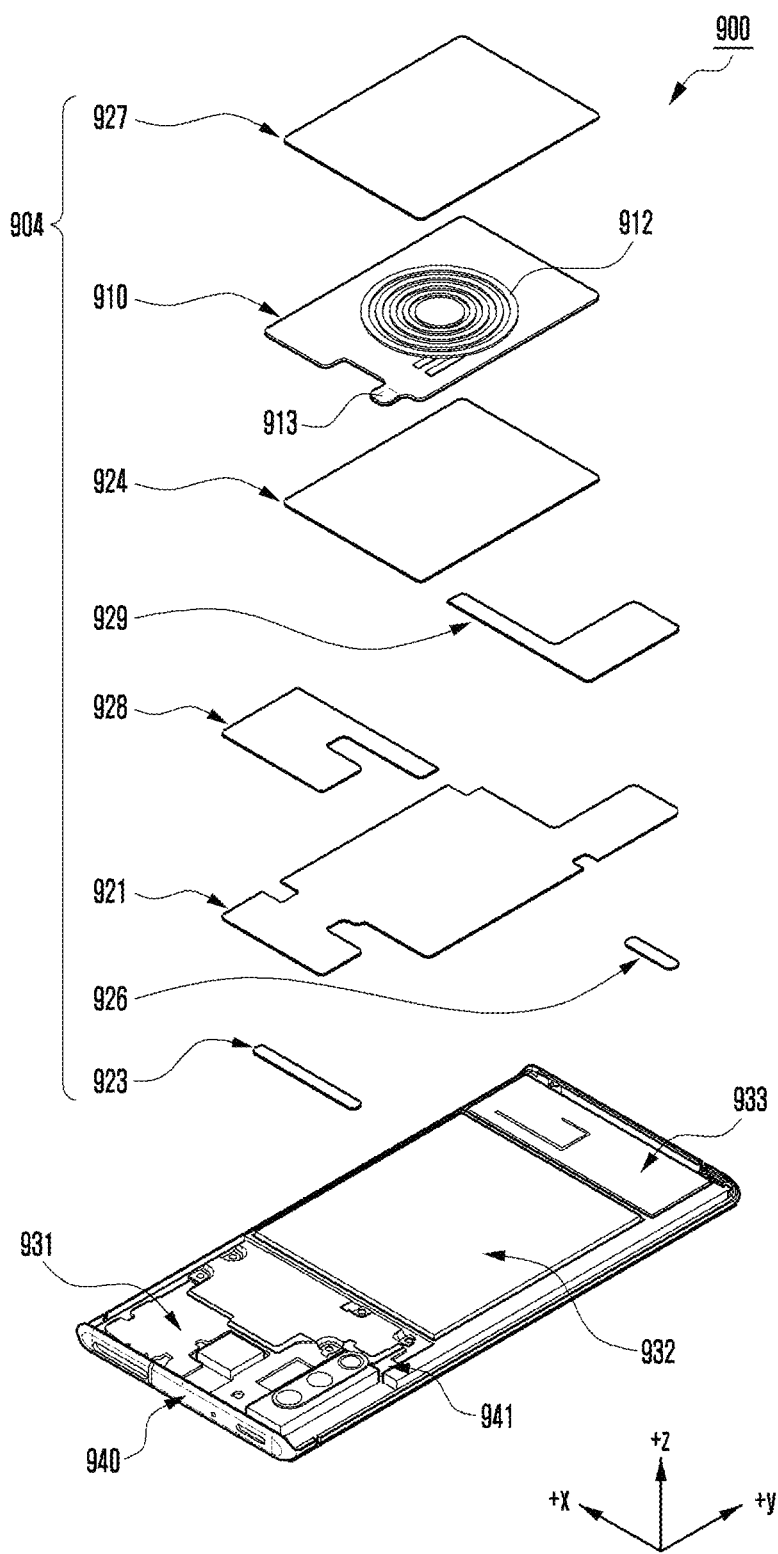
FIG. 9B illustrates an exploded perspective view of the electronic device of FIG. 9A according to an embodiment of this disclosure.

FIG. 9A illustrates an exploded cross-sectional view of the FPCB structure 904 in the electronic device 900 according to various embodiments of this disclosure. FIG. 9B illustrates an exploded perspective view of the electronic device 900 of FIG. 9A according to an embodiment of this disclosure.

With reference to FIGS. 9A and 9B, in one embodiment, the electronic device 900 (e.g., electronic device 100 in FIG. 2) may include a side member 940, a support member 941, an FPCB structure 904, a first structure 931, a second structure 932, or a third structure 933. The side member 940 may be the side member 410 in FIG. 4A, and the support member 941 may be the support member 420 in FIG. 4A. The first structure 931 may be the first structure 331 in FIG. 3 or 4A. The second structure 932 may be the second structure 332 in FIG. 3 or 4A. The third structure 933 may be the third structure 333 in FIG. 3 or 4A. The FPCB structure 904 may be disposed across from the first structure 931 to the third structure 933, may be bonded to the first structure 931 through the third layer 923, and may be bonded to the third structure 933 through the sixth layer 926.

According to an embodiment, the FPCB structure 904 may include an FPCB 910 including at least one planar coil 912, a first layer 921, a third layer 923, a fourth layer 924, a sixth layer 926, an eighth layer 928, or a ninth layer 929. Although not shown, an adhesive material (e.g., thermally conductive adhesive material) may be disposed between two layers bonded face-to-face. This bonding material may include various polymers capable of preventing separation of the two layers due to external impact. The FPCB 910 may be the FPCB 310 including the planar coil 312 in FIG. 3 or 4A. The fourth layer 924 may be the fourth layer 324 in FIG. 3 or 4A. The seventh layer 927 may be the seventh layer 327 in FIG. 3 or 4A. The eighth layer 928 may be more resilient and have a greater tensile strength than the first layer 921, and may be, for example, the eighth layer 828 in FIG. 8A or 8B. The ninth layer 929 may be more resilient and have a greater tensile strength than the first layer 921, and may be, for example, the ninth layer 829 in FIG. 8A or 8B.

According to an embodiment, the first layer 921 may be made of a thermally conductive material such as graphite. When viewed from above the seventh layer 927, the first layer 921 may include a first portion 9211 that at least partially overlaps with the FPCB 910, and a second portion 9212 that extends from the first portion 9211 to partially overlap the eighth portion 9281 (e.g., eighth portion 8281 in FIG. 8A) of the eighth layer 928. When viewed from above the seventh layer 927, the first layer 921 may include a fifth portion 9213 that extends from the first portion 9211 to partially overlap the tenth portion 9291 (e.g., tenth portion 8291 in FIG. 8A) of the ninth layer 929.

According to an embodiment, when viewed from above the seventh layer 927, the second portion 9212 of the first layer 921 may partially overlap the first structure 931, and the fifth portion 9213 of the first layer 921 may partially overlap the third structure 933.

According to an embodiment, the third layer 923 may bond a part of the eighth portion 9281 that does not overlap the first layer 921 to the first structure 931 between the eighth layer 928 and the first structure 931. According to an embodiment, the sixth layer 926 may bond a part of the tenth portion 9291 that does not overlap the first layer 921 to the third structure 933 between the ninth layer 929 and the third structure 933.

According to an embodiment, the eighth layer 928 and the ninth layer 929 may reduce transmission of external impact caused by a drop or an external force to the first layer 821. For example, when an external shock occurs due to a fall or an external force, the eighth layer 928 and the ninth layer 929 may disperse or absorb the external shock. For example, when an external shock occurs due to a fall or an external force, the eighth layer 928 and the ninth layer 929 may transfer the external shock to the FPCB 910.

According to an embodiment, heat released from the first structure 931 may move to the first layer 921 and may be diffused over the first layer 921. Heat may move from the first layer 921 to the third structure 933. According to various embodiments (not shown), a thermally conductive adhesive material may be disposed between the second portion 9212 of the first layer 921 and the first structure 931, and/or between the fifth portion 9213 of the first layer 921 and the third structure 933. Based on from the high temperature part to the low temperature part, various other heat movement paths may be formed, and at least a portion of the first structure 931, the second structure 932, the third structure 933, or the FPCB structure 904 may be utilized as a heat dissipation element.

Figure 10A:
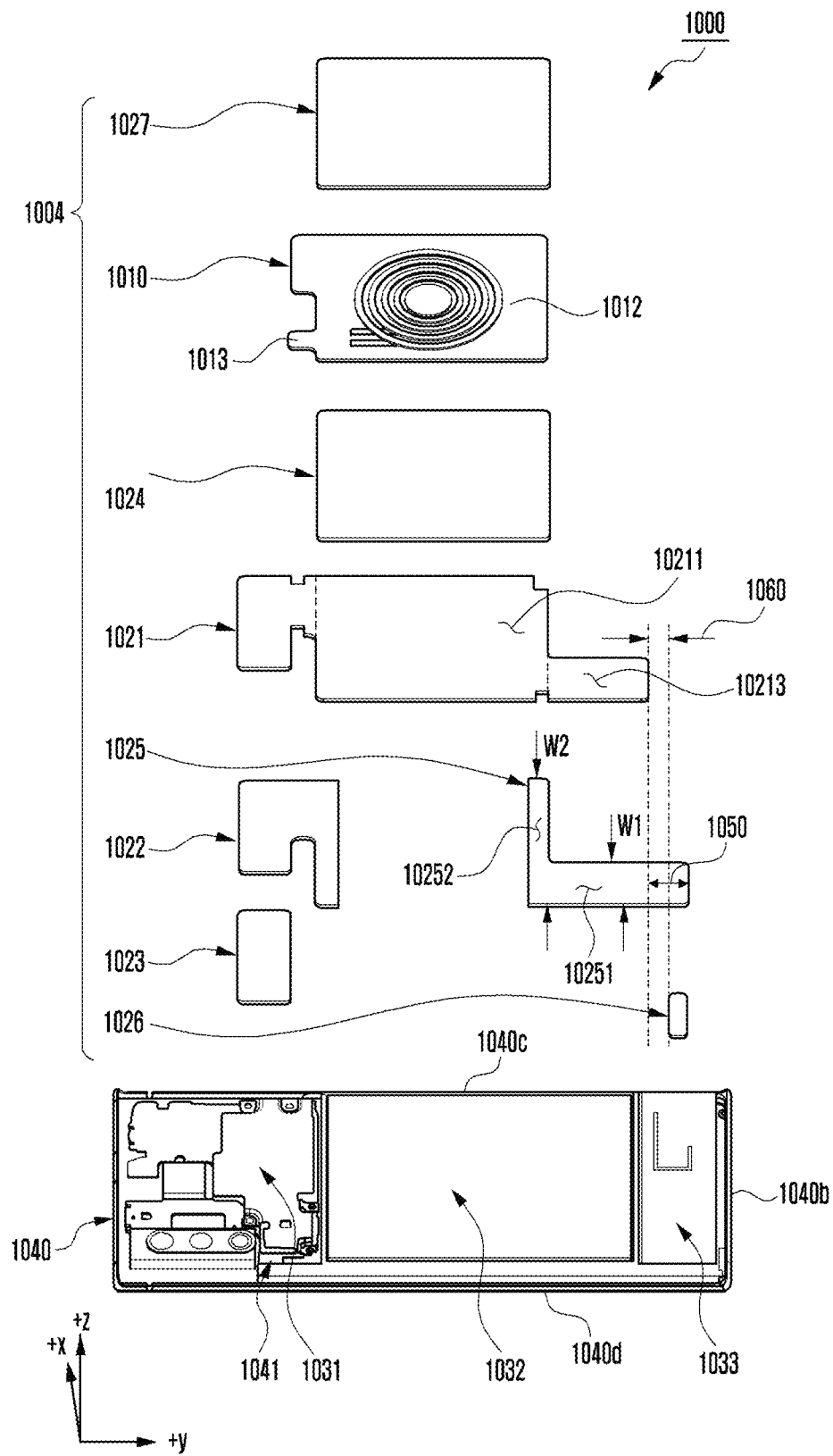
FIG. 10A illustrates an exploded perspective view of the electronic device according to various embodiments of this disclosure.
Figure 10B:
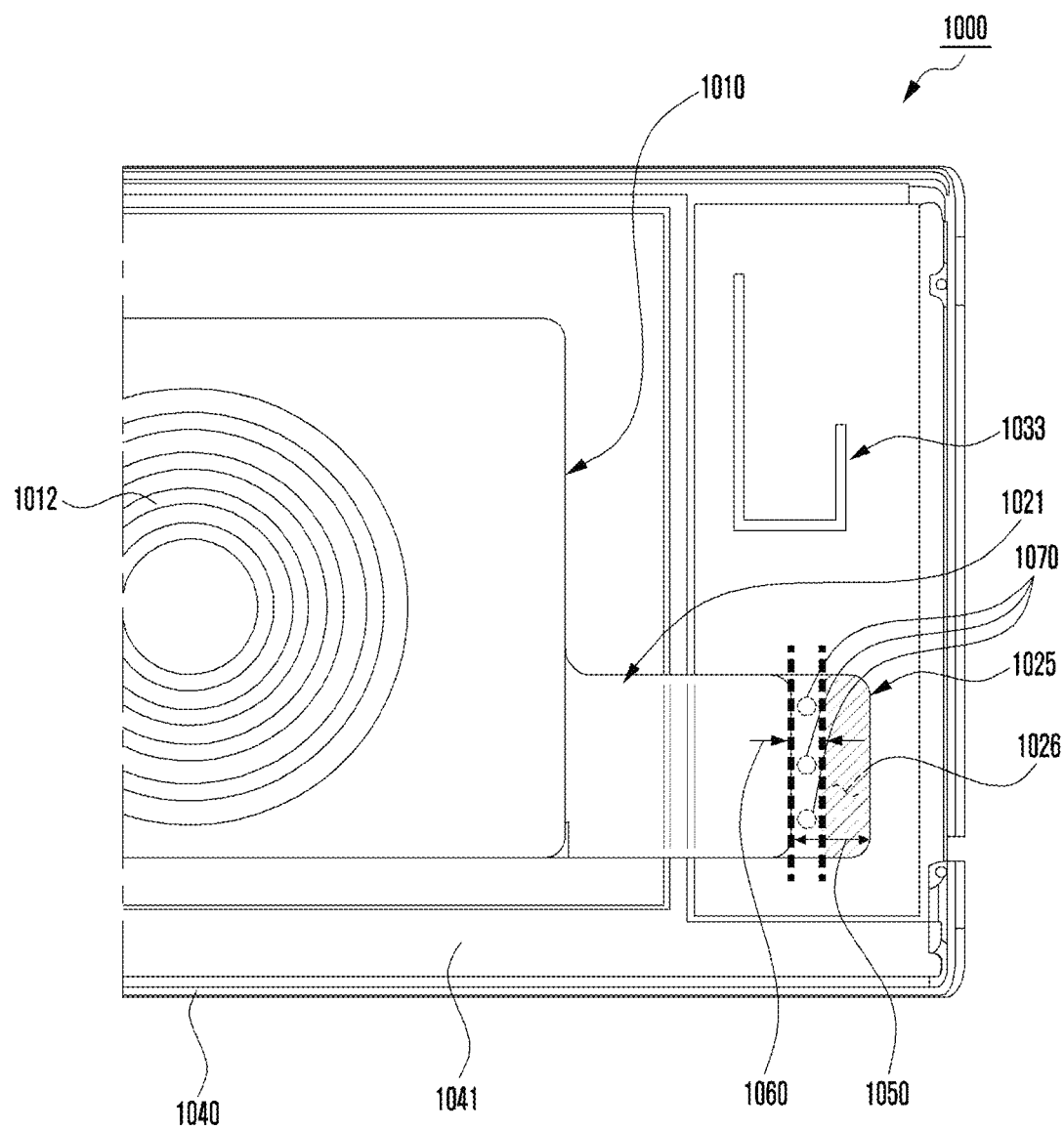
FIG. 10B illustrates a plan view of the electronic device of FIG. 10A according to an embodiment of this disclosure.

FIG. 10A illustrates an exploded perspective view of the electronic device 1000 according to various embodiments of this disclosure. FIG. 10B illustrates a plan view of the electronic device 1000 of FIG. 10A according to an embodiment of this disclosure.

With reference to FIGS. 10A and 10B, in one embodiment, the electronic device 1000 (e.g., electronic device 100 in FIG. 2) may include a side member 1040, a support member 1041, an FPCB structure 1004, a first structure 1031, a second structure 1032, or a third structure 1033. The side member 1040 may be the side member 410 in FIG. 4A, and the support member 1041 may be the support member 420 in FIG. 4A. The first structure 1031 may be the first structure 331 in FIG. 3 or 4A. The second structure 1032 may be the second structure 332 in FIG. 3 or 4A. The third structure 1033 may be the third structure 333 in FIG. 3 or 4A. The FPCB structure 1004 may be disposed across from the first structure 1031 to the third structure 1033, may be bonded to the first structure 1031 through the third layer 1023, and may be bonded to the third structure 1033 through the sixth layer 1026.

According to an embodiment, the FPCB structure 1004 may include an FPCB 1010 including at least one planar coil 1012, a first layer 1021, a second layer 1022, a third layer 1023, a fourth layer 1024, a fifth layer 1025, a sixth layer 1026, or a seventh layer 1027. Although not shown, an adhesive material (e.g., thermally conductive adhesive material) may be disposed between two layers bonded face-to-face. This bonding material may include various polymers capable of preventing separation of the two layers due to external impact. The FPCB 1010 may be the FPCB 310 including the planar coil 312 in FIG. 3 or 4A. The first layer 1021 may include a thermally conductive material such as graphite, and may be, for example, the first layer 321 in FIG. 3 or 4A. The second layer 1022 may be more resilient and have a greater tensile strength than the first layer 1021, and may be, for example, the second layer 322 in FIG. 3 or 4A. The fourth layer 1024 may be the fourth layer 324 in FIG. 3 or 4A. The third layer 1023 may bond the second layer 1022 and the first structure 1031, and may be, for example, the third layer 323 in FIG. 3 or 4A. The seventh layer 1027 may be the seventh layer 327 in FIG. 3 or 4A.

According to an embodiment, the fifth layer 1025 may be more resilient and have a greater tensile strength than the first layer 1021, and may include an extension portion 1050 that further extends toward the second side part 1040b of the side member 1040 (e.g., second side part 412 in FIG. 4A) when viewed from above the seventh layer 1027. The extension portion 1050 may not overlap the first layer 1021. The sixth layer 1026 may bond the extension portion 1050 and the third structure 1033 together. According to an embodiment, when viewed from above the seventh layer 1027, the sixth layer 1026 may be disposed to be spaced apart from the fifth layer 1025 toward the second side part 1042 of the side member 1040. According to an embodiment, when external impact occurs due to a fall or an external force, the stress may be relatively concentrated in a section 1060 between the section (not shown) in which the extension portion of the fifth layer 1025 overlaps the first layer 1021 and the section (not shown) in which the extension portion overlaps the sixth layer 1026. The section 1060 of the fifth layer 1025 may elastically withstand stress. The structure relatively concentrating stress in the section 1060 of the fifth layer 1025 may reduce damage to the first layer 1210. When viewed from above the seventh layer 1027, the fifth layer 1025 may include a seventh portion 10252 overlapping the first portion 10211 (e.g., first portion 3211 in FIG. 3 or 4A) of the first layer 1021, and a sixth portion 10251 overlapping the fifth portion 10213 (e.g., fifth portion 3213 in FIG. 3 or 4A) of the first layer 1021. In a direction from the third side part 1040c of the side member 1040 to the fourth side part 1040d, the width W1 of the sixth portion 10251 may be formed smaller than the width W2 of the seventh portion 10252, which may contribute to the structure relatively concentrating stress in the section 1060.

Various other structures can concentrate stress to one side. According to various embodiments, additionally, a plurality of openings 1070 (e.g., through holes) may be formed in the section 1060. The plurality of openings 1070 may reduce the volume of the medium in the extension portion 1050, contributing to the structure capable of concentrating stress to one side.

Figure 11A:
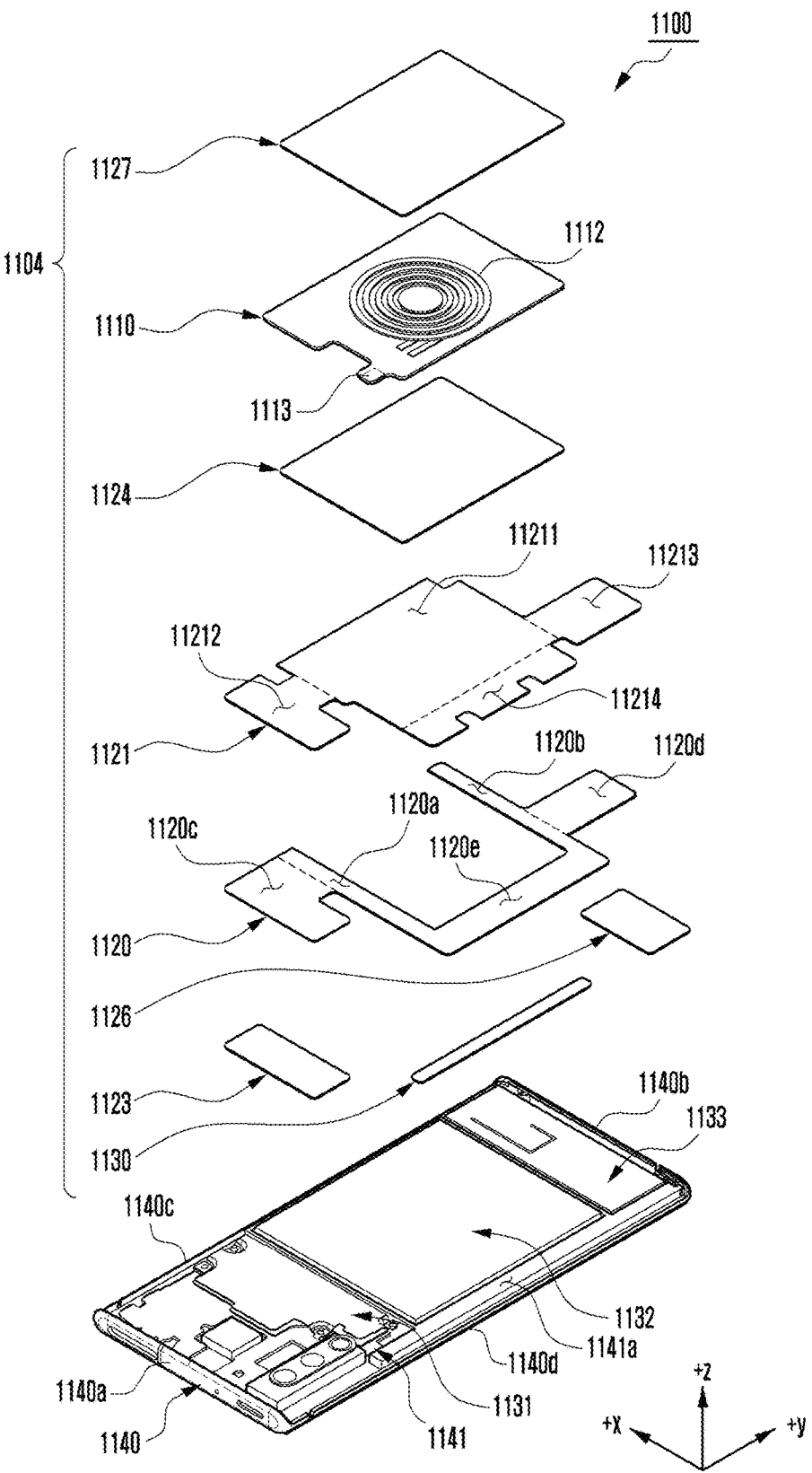
FIG. 11A illustrates an exploded perspective view of the electronic device according to various embodiments of this disclosure.
Figure 11B:
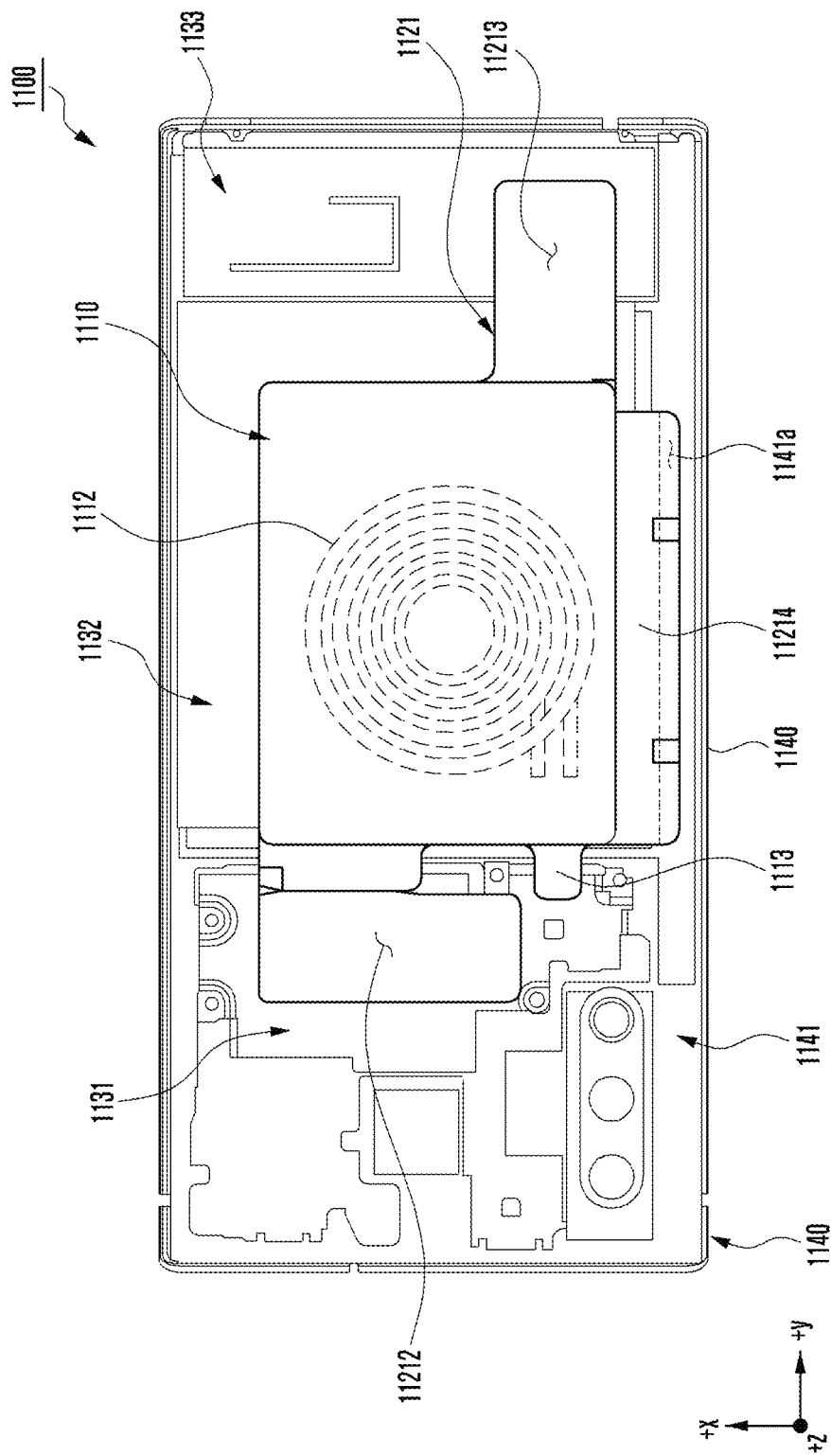
FIG. 11B illustrates a plan view of the electronic device of FIG. 11A according to an embodiment of this disclosure.

FIG. 11A illustrates an exploded perspective view of the electronic device 1100 according to various embodiments of this disclosure. FIG. 11B illustrates a plan view of the electronic device 1100 of FIG. 11A according to an embodiment of this disclosure.

According to various embodiments, the first layer 321 in FIG. 3 or 4A, the first layer 821 in FIG. 8A or 8B, the first layer 921 in FIG. 9A or 9B, or the first layer 1021 in FIG. 10A or 10B may be further extended. An embodiment related thereto will be described with reference to FIGS. 11A and 11B.

With reference to FIGS. 11A and 11B, in one embodiment, the electronic device 1100 (e.g., electronic device 100 in FIG. 2) may include a side member 1140, a support member 1141, an FPCB structure 1104, a first structure 1131, a second structure 1132, or a third structure 1133. The side member 1140 may be the side member 410 in FIG. 4A, and the support member 1141 may be the support member 420 in FIG. 4A. The first structure 1131 may be the first structure 331 in FIG. 3 or 4A. The second structure 1132 may be the second structure 332 in FIG. 3 or 4A. The third structure 1133 may be the third structure 333 in FIG. 3 or 4A. According to an embodiment, the FPCB structure 1104 may be disposed across from the first structure 1131 to the third structure 1133, may be bonded to the first structure 1131 through the third layer 1123, may be bonded to the third structure 1033 through the sixth layer 1126, and may be bonded to the support member 1141 through the tenth layer 1130.

According to an embodiment, the FPCB structure 1104 may include an FPCB 1110 including at least one planar coil 1112, a first layer 1121, a second layer 1120, a third layer 1123, a sixth layer 1126, a tenth layer 1130, a fourth layer 1124, or a seventh layer 1127. Although not shown, an adhesive material (e.g., thermally conductive adhesive material) may be disposed between two layers bonded face-to-face. This bonding material may include various polymers capable of preventing separation of the two layers due to external impact.

For example, the FPCB 1110 may be the FPCB 310 including the planar coil 312 in FIG. 3 or 4A. The fourth layer 1124 may be the fourth layer 324 in FIG. 3 or 4A. The seventh layer 1027 may be the seventh layer 327 in FIG. 3 or 4A.

According to an embodiment, the first layer 1121 may include a thermally conductive material such as graphite. When viewed from above the seventh layer 1127, the first layer 1121 may include a first portion 11211 (e.g., first portion 3211 in FIG. 3 or 4A) that at least overlaps the FPCB 1110, a second portion 11212 (e.g., second portion 3212 in FIG. 3 or 4A) that extends from the first portion 11211 to at least partially overlap the first structure 1131, and a fifth portion 11213 (e.g., fifth portion 3213 in FIG. 3 or 4A) that extends from the first portion 11211 to at least partially overlap the third structure 1133. According to an embodiment, when viewed from above the seventh layer 1127, the first layer 1121 may include a twelfth portion 11214 that overlaps a portion 1141a of the support member 1141. When viewed from above the seventh layer 1127, the twelfth portion 11214 may at least not overlap the FPCB 1110.

According to an embodiment, the second layer 1120 may be more resilient and have a greater tensile strength than the first layer 1121. The second layer 1120 may reduce transmission of external impact caused by a drop or an external force to the first layer 1121. When viewed from above the seventh layer 1127, the second layer 1120 may include portions 1120a and 1120b that partially overlap the first portion 11211 of the first layer 1121. The portions 1120a and 1120b may be extended in a direction from the third side part 1040c (e.g., third side part 413 in FIG. 4B) of the side member 1040 to the fourth side part 1040d (e.g., fourth side part 414 in FIG. 4B). The portions 1120a and 1120b may be disposed to be spaced apart from each other in a direction from the first side part 1040a (e.g., first side part 411 in FIG. 4B) of the side member 1040 to the second side part 1040b (e.g., second side part 412 in FIG. 4B). When viewed from above the seventh layer 1127, the second layer 1120 may include a portion 1120c overlapping the second portion 11212 of the first layer 1121, and a portion 1120d overlapping the fifth portion 11213 of the first layer 1121. When viewed from above the seventh layer 1127, the second layer 1120 may include a thirteenth portion 1120e overlapping the twelfth portion 11214 of the first layer 1121.

According to an embodiment, the portion 1120c of the second layer 1120 may be bonded to the first structure 1131 through the third layer 1123. According to an embodiment, the portion 1120d of the second layer 1120 may be bonded to the third structure 1133 through the sixth layer 1126. The third layer 1123 or the sixth layer 1126 may be an adhesive material of various polymers.

According to an embodiment, the thirteenth portion 1120e of the second layer 1120 may be bonded to the portion 1141a of the support member 1141 through the tenth layer 1130. The tenth layer 1130 may include adhesive materials of various polymers, and may be disposed along the thirteenth portion 1120e. The portion 1141a of the support member 1141 to which the thirteenth portion 1120e of the second layer 1120 is bonded may be located near the fourth side part 1140d (e.g., fourth side part 414 in FIG. 4B) of the side member 1140 or between the second structure 1132 and the fourth side part 1140d when viewed from above the seventh layer 1127. The structure in which the second layer 1120 is bonded to the support member 1141 may reduce transmission of external impact caused by a drop or an external force to the first layer 1121. In the structure in which the second layer 1120 is bonded to the support member 1141, the heat released from the first structure 1131, the second structure 1132, or the third structure 1133 may move to the support member 1141 and the side member 1140 connected thereto or integrally formed therewith.

According to various embodiments, the portion 1141a of the support member 1141 to which the thirteenth portion 1120e of the second layer 1120 is bonded may be defined as a fourth structure different from the first structure 1131, the second structure 1132, or the third structure 1133.

According to an embodiment of the disclosure, an electronic device (e.g., electronic device 300 in FIG. 3) may include a housing (e.g., housing 110 in FIG. 1A). The electronic device may include a first structure (e.g., first structure 331 in FIG. 3) that is disposed in the housing and includes a first surface (e.g., first surface 3311 in FIG. 3) facing one surface (e.g., flat outer surface 3021 in FIG. 3) of the housing, and a second structure (e.g., second structure 332 in FIG. 3) including a second surface (e.g., second surface 3321 in FIG. 3) facing the one surface of the housing. The electronic device may include an FPCB structure (e.g., FPCB structure 304 in FIG. 3) that is disposed in the housing and is extended from the first surface to the second surface. The FPCB structure may include an FPCB (e.g., FPCB 310 in FIG. 3) that at least partially overlaps the second surface and includes at least one coil (e.g., planar coil 312 in FIG. 3). The FPCB structure may include a thermally conductive first layer (e.g., first layer 321 in FIG. 3) that includes a first portion (e.g., first portion 3211 in FIG. 3) that at least partially overlaps the FPCB and is disposed between the FPCB and the second surface, and a second portion (e.g., second portion 3212 in FIG. 3) that is extended from the first portion to at least partially overlap the first surface. The FPCB structure may include a second layer (e.g., second layer 322 in FIG. 3) that includes a third portion (e.g., third portion 3221 in FIG. 3) at least partially overlapping the second portion, and a fourth portion (e.g., fourth portion 3222 in FIG. 3) that is extended from the third portion to partially overlap the first portion, the second layer being more resilient and having a greater tensile strength than the first layer. The FPCB structure may include an adhesive third layer (e.g., third layer 323 in FIG. 3) disposed between the third portion and the first surface.

According to an embodiment of the disclosure, the first layer (e.g., first layer 321 in FIG. 3) may include graphite.

According to an embodiment of the disclosure, the second layer (e.g., second layer 322 in FIG. 3) may include engineering plastic.

According to an embodiment of the disclosure, the housing may include the other surface (e.g., first surface 110A in FIG. 1A) disposed on the opposite side to the one surface (e.g., flat outer surface 3021 in FIG. 3). The second layer (e.g., second layer 322 in FIG. 3) may be disposed between the first layer (e.g., first layer 721 in FIG. 6) and the other surface. The FPCB (e.g., FPCB 710 in FIG. 6) may be bonded to the second layer through at least one opening (e.g., plural openings 7001 and 7002 in FIG. 6) formed in the second layer (e.g., fifth layer 725 in FIG. 6).

According to an embodiment of the disclosure, the at least one opening (e.g., plural openings 7001, 7002, 7003 and 7004 in FIG. 7) may be arranged in correspondence to a boundary portion (e.g., first boundary portion 305 or second boundary portion 306 in FIG. 3) between the first structure and the second structure.

According to an embodiment of the disclosure, the fourth portion (e.g., ninth portion 9282 in FIG. 9A) of the second layer (e.g., eighth layer 928 in FIG. 9A) may be disposed between the FPCB (e.g., FPCB 910 in FIG. 9A) and the first layer (e.g., first layer 921 in FIG. 9A). The second portion (e.g., second portion 9212 in FIG. 9A) of the first layer may overlap a portion of the second layer. The third layer (e.g., third layer 923 in FIG. 9A) may overlap a portion (e.g., eighth portion 9281) of the second layer that does not overlap the first layer.

According to an embodiment of the disclosure, the FPCB structure (e.g., FPCB structure 804 in FIG. 8A) may further include a fourth layer (e.g., eighth layer 828 in FIG. 8A) that is disposed on the opposite side to the second layer (e.g., second layer 822 in FIG. 8A) with the first layer (e.g., first layer 821 in FIG. 8A) interposed therebetween. The fourth layer (e.g., eighth layer 828 in FIG. 8A) may be formed along the second layer, and may be more resilient and have a greater tensile strength than the first layer.

According to an embodiment of the disclosure, the FPCB structure (e.g., FPCB structure 304 in FIG. 3) may further include a fourth layer (e.g., fourth layer 824 in FIG. 3) that is disposed between the FPCB (e.g., FPCB 310 in FIG. 3) and the first layer (e.g., first layer 321 in FIG. 3) and includes ferrite.

According to an embodiment of the disclosure, the housing may include the other surface (e.g., first surface 110A in FIG. 1A) disposed on the opposite side to the one surface (e.g., flat outer surface 3021 in FIG. 3). The second layer (e.g., fifth layer 1025 in FIG. 10B) may be disposed between the first layer (e.g., first layer 1021 in FIG. 10B) and the other surface, and may include a section (e.g., section 1060 in FIG. 10B) in which the first layer and the third layer (e.g., sixth layer 1026 in FIG. 10B) do not overlap.

According to an embodiment of the disclosure, the FPCB structure (e.g., FPCB structure 1004 in FIG. 10A) may include at least one opening (e.g., plural openings 1070 in FIG. 10B) formed in the section (e.g., section 1060 in FIG. 10B).

According to an embodiment of the disclosure, the first structure (e.g., first structure 331 in FIG. 6) as a substrate assembly may include a first PCB (e.g., first PCB 421 in FIG. 6), a second PCB (e.g., second PCB 422 in FIG. 6) partially overlapping the first PCB, a shielding member (e.g., shielding member 423 in FIG. 6) at least partially overlapping the second PCB and forming the first surface (e.g., first surface 3311 in FIG. 3), and an interposer substrate between the first PCB and the second PCB.

According to an embodiment of the disclosure, the first structure (e.g., third structure 333 in FIG. 3) may include an input and output assembly that includes at least one of a speaker module, a PCB including a USB connector, a microphone module, or an antenna pattern.

According to an embodiment of the disclosure, the second structure (e.g., second structure 332 in FIG. 3) may include a battery.

According to an embodiment of the disclosure, an electronic device (e.g., electronic device 300 in FIG. 3) may include a housing (e.g., housing 110 in FIG. 1A) that includes a front plate (e.g., front plate 301 in FIG. 3) and a rear plate (e.g., rear plate 302 in FIG. 3) disposed on the opposite side to the front plate. The electronic device may include a display (e.g., display 101 in FIG. 2) that is disposed within the housing and arranged along at least some of the front plate. The electronic device may include a first structure (e.g., first structure 331 in FIG. 3) disposed between the display and the rear plate and including a first surface (e.g., first surface 3311 in FIG. 3) facing the rear plate, a second structure (e.g., second structure 332 in FIG. 3) including a second surface (e.g., second surface 3321 in FIG. 3) facing the rear plate, and a third structure (e.g., third structure 333 in FIG. 3) that is disposed to be spaced apart from the first structure with the second structure interposed therebetween and includes a third surface (e.g., third surface 3331 in FIG. 3) facing the rear plate. The electronic device may include an FPCB structure (e.g., FPCB structure 304 in FIG. 3) disposed between the display and the rear plate, and the FPCB structure may include an FPCB (e.g., FPCB 310 in FIG. 3) that overlaps at least partially with the second surface and includes at least one coil (e.g., planar coil 312 in FIG. 3). The FPCB structure may include a thermally conductive layer (e.g., first layer 321 in FIG. 3) that extends to the first surface and the third surface with a portion (e.g., first portion 3211 in FIG. 3) at least partially overlapping the FPCB interposed therebetween. The FPCB structure may include a first elastic layer (e.g., second layer 322 in FIG. 3) that is disposed between the first surface and the thermally conductive layer, and is more elastic and has a greater tensile strength than the thermally conductive layer. The FPCB structure may include a second elastic layer (e.g., fifth layer 325 in FIG. 3) that is disposed between the third surface and the thermally conductive layer, and is more elastic and has a greater tensile strength than the thermally conductive layer. The FPCB structure may include a first adhesive layer (e.g., third layer 323 in FIG. 3) disposed between the first elastic layer and the first surface. The FPCB structure may include a second adhesive layer (e.g., sixth layer 326 in FIG. 3) disposed between the second elastic layer and the third surface.

According to an embodiment of the disclosure, the thermally conductive layer (e.g., first layer 321 in FIG. 3) may include graphite.

According to an embodiment of the disclosure, the first elastic layer (e.g., second layer 322 in FIG. 3) or the second elastic layer (e.g., fifth layer 325 in FIG. 3) may include PET.

According to an embodiment of the disclosure, the thermally conductive layer (e.g., second layer 722 in FIG. 6) may include at least one opening (e.g., plural openings 7001 and 7002 in FIG. 6, such as notches) formed in correspondence to a boundary portion (e.g., first boundary portion 305 in FIG. 3) between the first structure and the second structure and/or a boundary portion (e.g., second boundary portion 306 in FIG. 3) between the second structure and the third structure. The FPCB (e.g., FPCB 710 in FIG. 6) may be bonded to the first elastic layer (e.g., second layer 722 in FIG. 7) and/or the second elastic layer (e.g., fifth layer 725 of FIG. 7) through the at least one opening.

According to an embodiment of the disclosure, the first structure (e.g., first structure 331 in FIG. 6) as a substrate assembly may include a first PCB (e.g., first PCB 421 in FIG. 6), a second PCB (e.g., second PCB 422 in FIG. 6) partially overlapping the first PCB, a shielding member (e.g., shielding member 423 in FIG. 6) at least partially overlapping the second PCB and forming the first surface (e.g., first surface 3311 in FIG. 3), and an interposer substrate between the first PCB and the second PCB.

According to an embodiment of the disclosure, the third structure (e.g., third structure 333 in FIG. 3) may include an input and output assembly that includes at least one of a speaker module, a PCB including a USB connector, a microphone module, or an antenna pattern.

According to an embodiment of the disclosure, the second structure (e.g., second structure 332 in FIG. 3) may include a battery.

The embodiments of the disclosure disclosed in the present specification and drawings are provided as specific examples to easily describe the contents of the disclosure and help understanding, and are not intended to limit the scope of the disclosure. Therefore, the scope of the disclosure should be construed to include not only the embodiments disclosed herein but also all changes or modifications derived based on the technical concept of the disclosure.

Although the present disclosure has been described with various embodiments, various changes and modifications may be suggested to one skilled in the art. It is intended that the present disclosure encompass such changes and modifications as fall within the scope of the appended claims.

What is claimed is:

1. An electronic device comprising:
a housing;
a first structure that is disposed in the housing and includes a first surface facing one surface of the housing, and a second structure including a second surface facing the one surface of the housing; and
an flexible printed circuit board (FPCB) structure disposed in the housing and extended from the first surface to the second surface, the FPCB structure including:
a FPCB that at least partially overlaps the second surface and includes at least one coil;
a first layer that is thermally conductive and at least partially overlaps the FPCB and includes a first portion disposed between the FPCB and the second surface, and a second portion that is extended from the first portion to at least partially overlap the first surface;
a second layer that includes a third portion at least partially overlapping the second portion, and a fourth portion that is extended from the third portion to partially overlap the first portion, the second layer being more elastic and including a greater tensile strength than the first layer; and
a third layer comprising an adhesive, the third layer disposed between the third portion and the first surface.

2. The electronic device of claim 1, wherein the first layer includes graphite.

3. The electronic device of claim 1, wherein the second layer includes engineering plastic.

4. The electronic device of claim 1, wherein:
the housing includes another surface disposed on opposite side to the one surface;
the second layer is disposed between the first layer and the other surface; and
the FPCB is bonded to the second layer through at least one opening formed in the second layer.

5. The electronic device of claim 4, wherein the at least one opening is arranged in correspondence to a boundary portion between the first structure and the second structure.

6. The electronic device of claim 1, wherein:
the fourth portion of the second layer is disposed between the FPCB and the first layer;
the second portion of the first layer overlaps a portion of the second layer; and
the third layer overlaps a portion of the second layer that does not overlap the first layer.

7. The electronic device of claim 1, wherein the FPCB structure further includes a fourth layer that is disposed on opposite side to the second layer with the first layer interposed therebetween, is formed along the second layer, and is more elastic and includes a greater tensile strength than the first layer.

8. The electronic device of claim 1, wherein the FPCB structure further includes a fourth layer that is disposed between the FPCB and the first layer and includes ferrite.

9. The electronic device of claim 1, wherein:
the housing includes another surface disposed on opposite side to the one surface; and
the second layer is disposed between the first layer and the other surface, and includes a section in which the first layer and the third layer do not overlap.

10. The electronic device of claim 9, comprising at least one opening formed in the section.

11. The electronic device of claim 1, wherein the first structure as a substrate assembly includes: a first printed circuit board (PCB), a second PCB partially overlapping the first PCB, a shielding member at least partially overlapping the second PCB and forming the first surface, and an interposer substrate between the first PCB and the second PCB.

12. The electronic device of claim 1, wherein the first structure includes an input and output assembly including at least one of: a speaker, a PCB including a USB connector, a microphone, or an antenna pattern.

13. The electronic device of claim 1, wherein the second structure includes a battery.

14. The electronic device of claim 1, wherein:
the housing includes a front plate, and a rear plate disposed on opposite side to the front plate;
the electronic device further comprises a display that is disposed within the housing and is disposed along at least a portion of the front plate;
the FPCB structure is disposed between the display and the rear plate; and
one surface of the housing is formed by the rear plate.

15. The electronic device of claim 1, wherein a first distance in which the one surface of the housing is spaced apart from the first surface and a second distance in which the one surface of the housing is spaced apart from the second surface are different from each other.

16. An electronic device comprising:
a housing including a front plate and a rear plate disposed on opposite side to the front plate;
a display disposed within the housing and arranged along at least some of the front plate;
a first structure disposed between the display and the rear plate and including a first surface facing the rear plate, a second structure including a second surface facing the rear plate, and a third structure that is disposed to be spaced apart from the first structure with the second structure interposed therebetween and includes a third surface facing the rear plate; and
an FPCB structure disposed between the display and the rear plate, and the FPCB structure including:
an FPCB overlapping at least partially with the second surface and including at least one coil;
a thermally conductive layer that extends to the first surface and the third surface with a portion at least partially overlapping the FPCB interposed therebetween;
a first elastic layer that is disposed between the first surface and the thermally conductive layer, and is more elastic and includes a greater tensile strength than the thermally conductive layer;
a second elastic layer that is disposed between the third surface and the thermally conductive layer, and is more elastic and includes a greater tensile strength than the thermally conductive layer;
a first adhesive layer disposed between the first elastic layer and the first surface; and
a second adhesive layer disposed between the second elastic layer and the third surface.

17. The electronic device of claim 16, wherein the thermally conductive layer includes graphite.

18. The electronic device of claim 16, wherein the first elastic layer or the second elastic layer includes polyethylene terephthalate (PET).

19. The electronic device of claim 16, wherein:
the thermally conductive layer includes at least one opening formed in correspondence to (i) a boundary portion between the first structure and the second structure or (ii) a boundary portion between the second structure and the third structure; and
the FPCB is bonded to the first elastic layer or the second elastic layer through the at least one opening.

20. The electronic device of claim 16,
wherein the first structure as a substrate assembly includes: a first PCB, a second PCB partially overlapping the first PCB, a shielding member at least partially overlapping the second PCB and forming the first surface, and an interposer substrate between the first PCB and the second PCB,
wherein the second structure includes a battery, and
wherein the third structure includes an input and output assembly including at least one of: a speaker, a PCB including a USB connector, a microphone, or an antenna pattern.

* * * * *